United States Patent [19]
Shiga et al.

[11] Patent Number: 5,635,813
[45] Date of Patent: Jun. 3, 1997

[54] ELECTRONIC APPARATUS, BATTERY MANAGEMENT SYSTEM, AND BATTERY MANAGEMENT METHOD

[75] Inventors: Masaaki Shiga; Kiyoaki Kikuchi; Masahiko Kumagai; Yoshiaki Takahira; Hiroshige Suzuki, all of Kanagawa, Japan

[73] Assignee: Mitsubishi Denki Kabushiki Kaisha, Tokyo, Japan

[21] Appl. No.: 331,027

[22] Filed: Oct. 27, 1994

[30] Foreign Application Priority Data

Dec. 21, 1993 [JP] Japan ............... 5-322367

[51] Int. Cl.⁶ .................. H02J 7/04; H01M 10/46
[52] U.S. Cl. ............................. 320/2; 320/48
[58] Field of Search .............. 320/2, 48; 429/96–100; 324/426, 427

[56] References Cited

U.S. PATENT DOCUMENTS

| | | |
|---|---|---|
| 5,274,319 | 12/1993 | Keener et al. ............... 320/2 |
| 5,455,499 | 10/1995 | Uskali et al. ............... 320/48 X |
| 5,460,901 | 10/1995 | Syrjälä ............... 429/90 |

FOREIGN PATENT DOCUMENTS

| | | |
|---|---|---|
| 2-294231 | 12/1990 | Japan. |
| 5-64301 | 3/1993 | Japan. |

*Primary Examiner*—Peter S. Wong
*Assistant Examiner*—Patrick B. Law
*Attorney, Agent, or Firm*—Wolf, Greenfield & Sacks, P.C.

[57] ABSTRACT

Methods and apparatus to enable electronic apparatuses to display the remaining power of exchangeable batteries at any given time. A battery pack having a battery and an ID generator is attached to an electronic apparatus. The accumulated consumption hours of the battery is stored in a battery information memory for each battery ID. A remaining power detector determines the remaining battery power on the basis of the accumulated consumption hours and displays it on a display unit. Because the remaining battery power is determined based on the consumption hours of a battery, the running hours of a battery can be displayed at any given time.

21 Claims, 31 Drawing Sheets

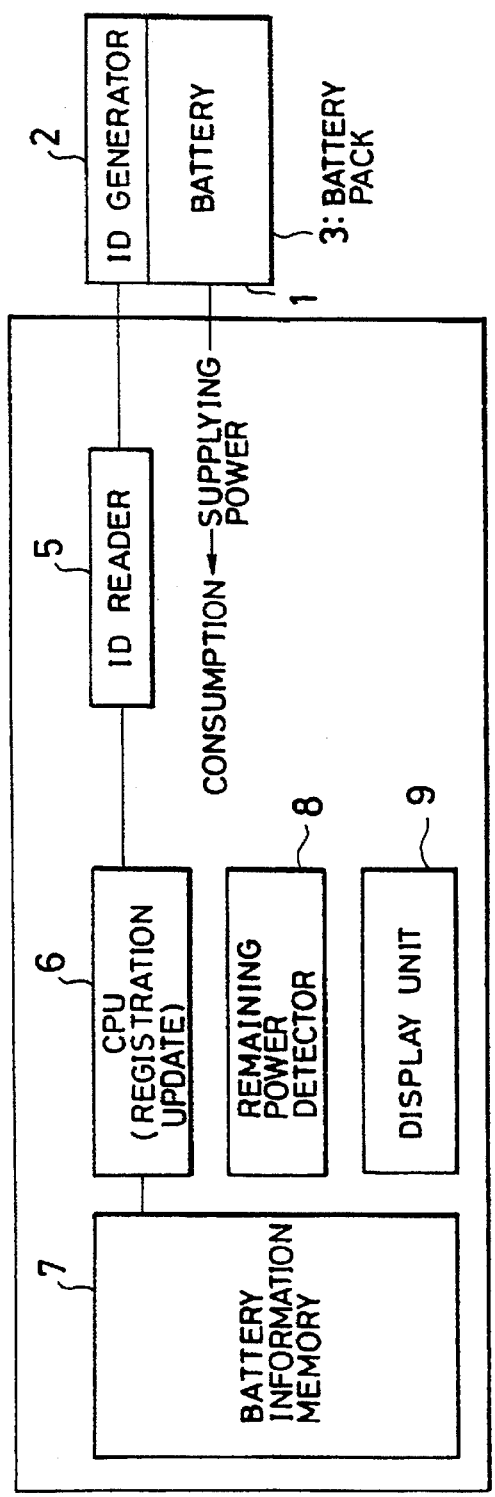

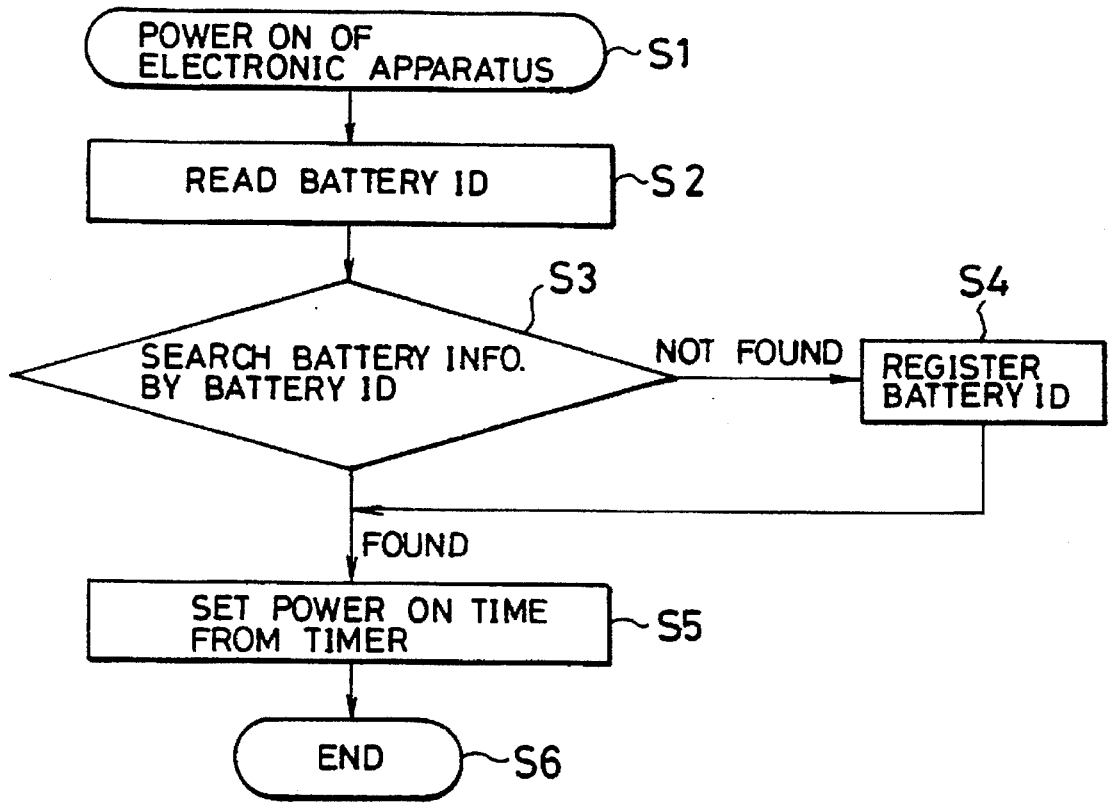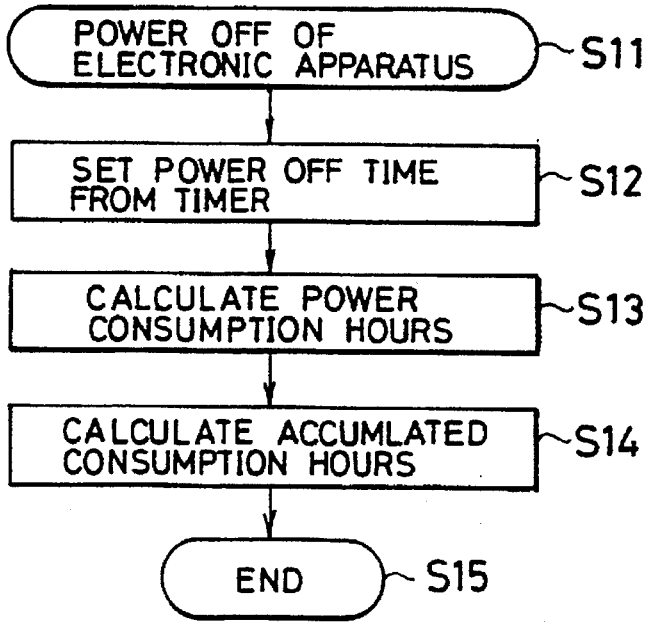

FIG.9

| | BATTERY ID | ON TIME | OFF TIME | POWER CONSUMPTION HOURS (OFF TIME − ON TIME) | ACCUMULATED CONSUMPTION HOURS | CHARGE (ON TIME) | CHARGE (OFF TIME) | CHARGED RATE |
|---|---|---|---|---|---|---|---|---|
| (a) | BT01 | 09:01:30 | 09:05:00 | 00:3:30 | 01:30:00 → 00:00:00 | 09:01:30 | 10:01:10 | 100% |
| (b) | BT02 | xxxxx | xxxx | xxxx | 06:32:00 → 05:00:00 | 10:00:00 | 10:30:00 | 50% |

ITEMS IN BATTERY INFORMATION MEMORY

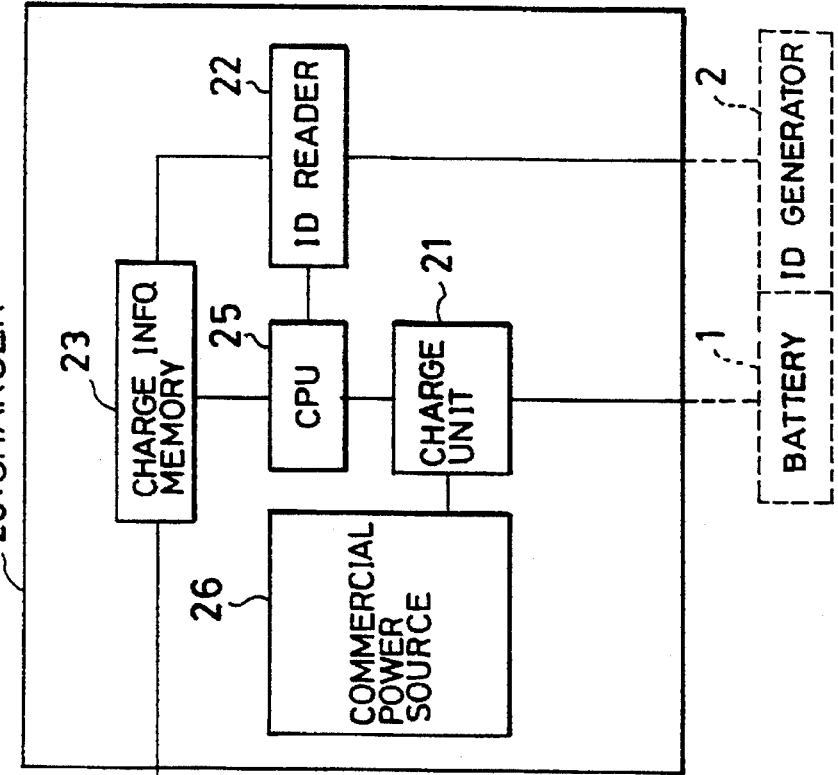
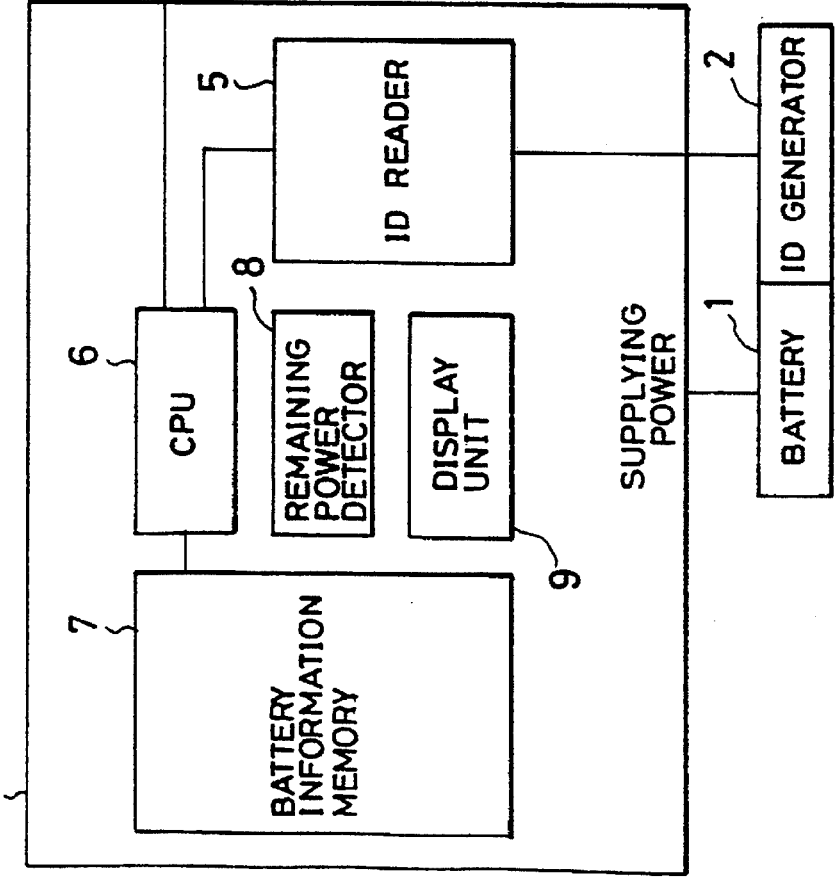
FIG.11

FIG.12 (a)

| BATTERY ID | CHARGED DATE | FULLY CHARGED TIME |
|---|---|---|
| BT01 | 1993:9:17 | 9:10:10 |

ITEMS IN CHARGE INFO. MEMORY

FIG.12 (b)

| BATTERY ID | ON TIME | OFF TIME | POWER CONSUMPTION HOURS OFF TIME − ON TIME) | ACCUMULATED CONSUMPTION HOURS | RUNNING DATE | CHARGED DATE | FULLY CHARGED TIME |
|---|---|---|---|---|---|---|---|
| BT01 | xxxx | 15:30:00 | xxxx | 02:10:10 → 00:00:00 | 1993:9:16 | 1993:9:17 | 9:10:10 |

ITEMS IN BATTERY INFORMATION MEMORY

FIG.14

| BATTERY ID | ON TIME | OFF TIME | POWER CONSUMPTION HOURS (OFF TIME - ON TIME) | ACCUMULATED CONSUMPTION HOURS | RUNNING DATE | CHARGE (ON TIME) | CHARGE (OFF TIME) | CHARGED DATE | FULL CHARGE FLAG |
|---|---|---|---|---|---|---|---|---|---|
| XXXX | | | | | | | | | |

{CHARGE (ON TIME), CHARGE (OFF TIME), CHARGED DATE, FULL CHARGE FLAG} TRANSFERRED FROM CHARGE INFO. MEMORY 23

ITEMS IN BATTERY INFORMATION MEMORY

FLOWCHART OF BATTERY EXCHANGE

FIG.23

| BATTERY ID | POWERED ELECTRONIC APPARATUS | ON TIME | OFF TIME | POWER CONSUMPTION HOURS | ACCUMULATED CONSUMPTION HOURS | CHARGE INFO. |
|---|---|---|---|---|---|---|
| BT01 | — | | | | | |
| BT02 | 4b | 9:30 | | | | |
| BT03 | 4a | 9:00 | | | | |
| BT04 | 4c | 11:00 | | | | |
| BT05 | 4d | 10:00 | | | | |
| BT06 | | | | | | |

BATTERY INFO. MEMORY IN MASTER ELECTRONIC APPARATUS

FIG.26

| BATTERY ID | ON TIME | OFF TIME | POWER CONSUMPTION HOURS (OFF TIME − ON TIME) | ACCUMULATED CONSUMPTION HOURS | TOTAL ACCUMULATED CONSUMPTION HOURS |
|---|---|---|---|---|---|
| BT01 | 09:01:30 | 09:05:00 | 00:3:30 | 01:30:00 | 98:30:20 |

ITEMS IN BATTERY INFORMATION MEMORY

FIG.27

| BATTERY ID | ON TIME | OFF TIME | POWER CONSUMPTION HOURS (OFF TIME – ON TIME) | ACCUMULATED CONSUMPTION HOURS | CHARGE (ON TIME) | CHARGE (OFF TIME) | CHARGED RATE | CHARGE COUNTER |
|---|---|---|---|---|---|---|---|---|
| BT01 | 09:01:30 | 09:05:00 | 00:3:30 | 01:30:00 | 09:01:30 | 09:50:10 | 100% | 120 TIMES |
| BT02 | XXXX | XXXX | XXXX | 04:32:00 | 10:00:00 | 10:20:00 | 50% | 55 TIMES |

ITEMS IN BATTERY INFORMATION MEMORY

TABLE OF ACCUMULATED OPERATION HOURS

| PERIPHERALS | COUNT | OPERATION HOURS | RATE |
|---|---|---|---|
| FDD ON | 30 | 0:30 SEC | 20% |
| HDD ON | 60 | 1:0 SEC | 20% |
| PRINTER ON | 600 | 10:0 SEC | 30% |
| CRT OFF | 300 | 5:0 SEC | 40% |
| ⋮ | ⋮ | ⋮ | ⋮ |

DISCHARGE CHARACTERISTIC

ELECTRONIC APPARATUS, BATTERY MANAGEMENT SYSTEM, AND BATTERY MANAGEMENT METHOD

BACKGROUND OF THE INVENTION

1. Field of the Invention

This invention relates to a battery having an identification with which to identify the battery. More specifically, this invention relates to an apparatus and a method of managing and displaying the remaining battery power correctly.

2. Description of the Related Art

Electronic apparatus, such as personal computers or TV cameras, have become increasingly used as portable devices. Most such electronic apparatus use rechargeable batteries, including nickel cadmium storage and nickel metal hydride storage batteries.

The discharge characteristics of those batteries are shown in FIG. 33. While terminal voltage remains constant after a battery is used for a long time, it rapidly drops once the remaining battery power becomes low. Thus, terminal voltage of an electronic apparatus using this type of battery must be monitored. An alarm is output when the terminal voltage drops low (Time T1 in FIG. 33). If the electronic apparatus is still used, the operation stops at time T2.

Nickel metal hydride or nickel cadmium storage batteries have a disadvantage in that the electronic apparatus stops a short time after the alarm is output, thereby requiring users to carry new batteries or a charger with them.

A conventional charger is explained below using FIG. 34. FIG. 34 shows a charger for an exchangeable charging battery pack, indicated in the Japan Unexamined Patent Publication 2-294231. This charger has the following components. A code reader 96a reads an identification code 92a displayed on a battery pack 92 in which a exchangeable battery is stored. A memory unit 96c stores charge management data of the battery pack, including the number of charges, and the content of the identification code. A data processor 96b manages the battery pack, including the processing for determining whether the number of charges has reached a predetermined number of times based on the charge management data. A display unit 94 displays the battery information, including the results of processing done by the data processor.

Conventional electronic apparatus have problems. Alarms output suddenly, while an electronic apparatus is being used and the apparatus is stopped shortly. This is because the remaining battery power is detected by measuring the terminal voltage of the battery. There are chargers that manage batteries by attaching an identifier to each battery. It is a charger, however, that manages batteries with identifiers and not an electronic apparatus that manages batteries with the identifiers. Electronic apparatus itself does not manage charge information for each battery even when the battery has an identifier.

SUMMARY OF THE INVENTION

Accordingly, it is a primary object of the present invention to provide an electronic apparatus that can identify the remaining battery power at any given time.

Another object of the present invention is to provide a battery management system and a method to know the remaining power of each battery even when the battery is to be used for another electronic apparatus.

Another object of the present invention is to provide an electronic apparatus to display the remaining power based on the hours a battery is actually used by storing the consumption hours in a battery information memory unit installed in the electronic apparatus.

Another object of the present invention is to provide an electronic apparatus which displays the remaining battery power based on the consumption hours even when a new battery is used.

Another object of the present invention is to obtain the remaining battery power easily and rapidly based on the accumulated consumption hours.

Another object of the present invention is to provide an electronic apparatus which displays the remaining battery power even when a battery and a commercial power source are concurrently used.

Another object of the present invention is to provide an electronic apparatus which displays the remaining battery power even when a battery is charged, by calculating the amount of charged power based on the charge information.

Another object of the present invention is to provide an electronic apparatus which displays the correct remaining battery power even when a battery whose power level is unknown is set.

Another object of the present invention is to provide an electronic apparatus which indicates the life of a battery according to the total consumption hours of the battery.

Another object of the present invention is to tell the life of a battery according to the number of charged times.

Another object of the present invention is to provide a battery management system which can correctly display the remaining battery power even when a charger and an electronic apparatus are separate.

Another object of the present invention is to provide a battery management system which displays a correct remaining battery power by sharing or centrally managing the battery information when a battery is used for different electronic apparatus.

Another object of the present invention is to provide a battery management system which does not require any special hardware for battery information exchange when a battery is used for different electronic apparatus.

Another object of the present invention is to provide a battery management system which can transfer battery information without affecting the processing of the electronic apparatus by transmitting the battery information at a predetermined timing.

Another object of the present invention is to provide a battery management system that can display the correct remaining power for each battery by calculating the consumption hours based on the battery IDs.

Another object of the present invention is to provide a battery management system that can display and output the remaining power of a battery by registering a battery ID if the new battery's ID has not been registered.

Another object of the present invention is to provide a battery management system that can display the remaining battery power at any given time by obtaining the accumulated consumption hours up to the point.

The present invention relates to a method and apparatus for a battery having an identification and particularly relates to a method of managing and displaying the correct remaining battery power.

According to one aspect of the invention an electronic apparatus is provided, which receives power from a battery having an identification. The apparatus includes a mechanism for reading the identification, a mechanism for storing a table, which holds identifications and battery information, including power consumption information, a mechanism for updating the power consumption information in the table according to the power consumed by the battery and in accordance with the identification, a mechanism for detecting remaining power based on the power consumption information updated by the mechanism for updating the power consumption information, and a mechanism for displaying the remaining power.

According to another aspect of the invention, a battery management system is provided. The system includes a plurality of electronic apparatus, each of which consumes power and each having a battery with an ID. A memory mechanism is provided for storing battery information regarding the batteries, and an update mechanism is provided for updating the battery information stored in the memory mechanism. A management mechanism is provided for observing the remaining power of the battery based on the battery information stored by the memory mechanism.

In addition, a communication mechanism is provided for communicating and exchanging the battery information stored by the memory mechanism among the plurality of electronic apparatus.

According to yet another aspect of the invention, a method for managing at least one battery is provided.

The method includes the following steps: reading an identification from a battery; and searching a memory, holding battery information according to identification for the identification read in the first step. The battery information includes a power on time, and a power off time, power consumption hours, and an accumulated consumption hours. The method further includes the steps of setting the power on time in the battery information in the memory according to the identification; setting the power off time in the battery information in the memory according to the identification; calculating the power consumption hours of the battery and accumulating the power consumption hours to the accumulated consumption hours in the battery information in the memory; and detecting a level of a remaining power in the battery based on the accumulated consumption hours and outputting the level of the remaining power that is detected.

BRIEF DESCRIPTION OF THE DRAWINGS

FIG. 1 illustrates an example of an electronic apparatus according to the present invention;

FIG. 2 shows one example of items in the battery information memory according to the present invention;

FIG. 3 is an operational flowchart of an electronic apparatus according to the present invention;

FIG. 9 is an example of items in a battery information memory according to the present invention;

FIG. 11 is an example of a battery management system according to the present invention;

FIG. 12 represents an example of items in the charge information memory and battery information memory;

FIG. 14 is an example of items of a battery information memory according to the present invention;

FIG. 23 is an example of items in the battery information memory of a master electronics apparatus according to the present invention;

FIG. 26 is another example of a battery information memory according to the present invention;

FIG. 27 is another example of battery information memory according to the present invention;

DETAILED DESCRIPTION

Embodiment 1

Figure 4:
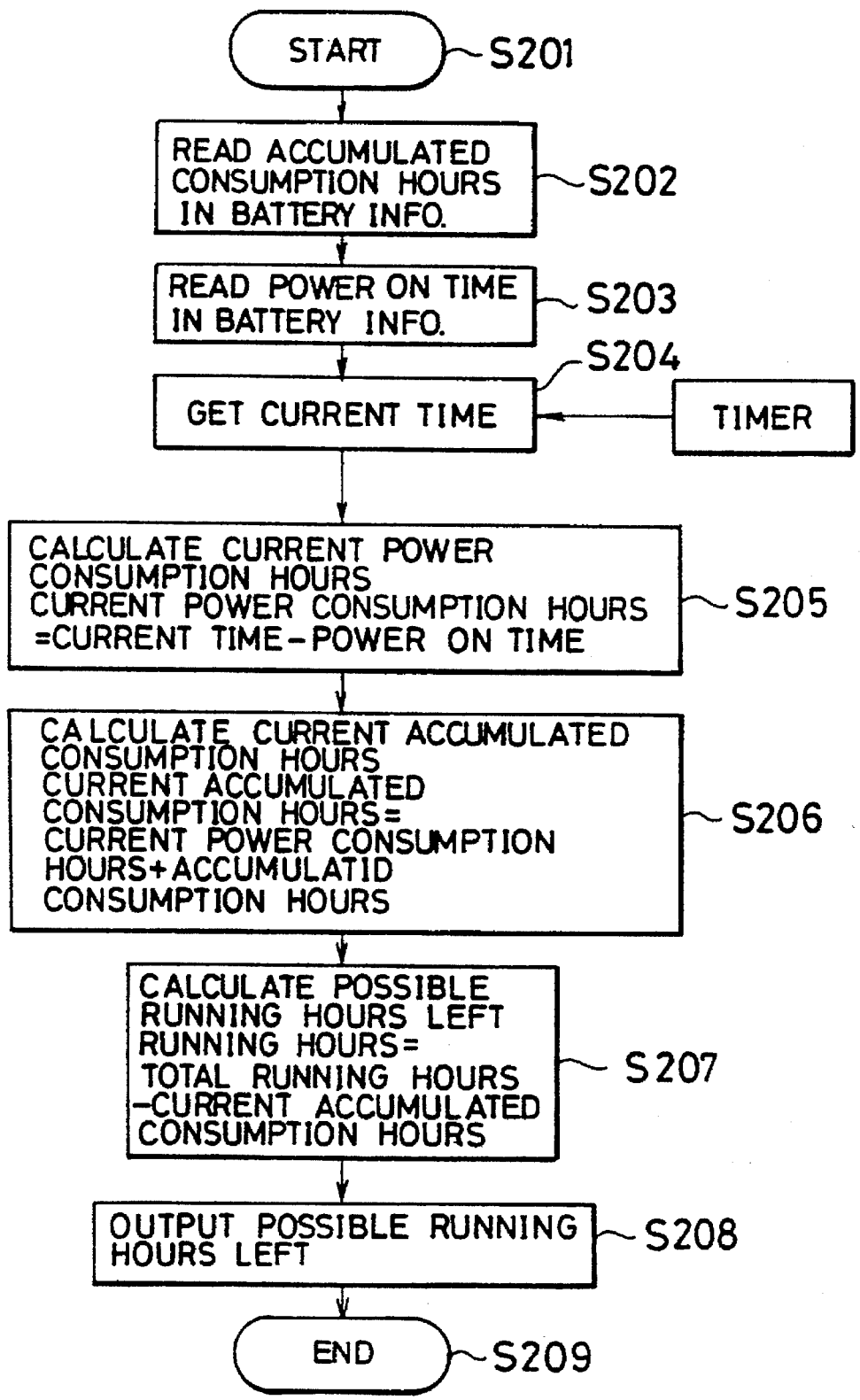
FIG. 4 is an operational flowchart of an electronic apparatus according to the present invention.

FIG. 1 illustrates an example of an electronic apparatus according to the present invention. In the figure, a battery 1 is used for an electronic apparatus. ID generator 2 is attached to batteries. Battery pack 3 has the battery 1 and the ID generator 2. The electronic apparatus receives its supply from the battery pack 3. ID reader 5 reads battery IDs from the ID generator 2 of the battery pack 3. The CPU 6 is provided in the electronic apparatus. A battery information memory 7 stores data for each battery ID. A remaining power detector 8 detects the remaining power of a battery based on its information in the battery information memory. A display unit 9 displays the remaining power detected by the remaining power detector 9.

FIG. 2 is an example of battery information stored in the battery information memory 7. The battery information is stored for each battery ID. The battery information has the following: the time when the user starts to use the electronic apparatus (also called as ON time); the time when the user stops to use it (called OFF time); consumption hours obtained from the on and off times; and the accumulated consumption hours.

Operation of an electronic apparatus is explained below using FIGS. 3 and 4. First, a battery pack is set in the designated place to make the electronic apparatus be in a ready state. The battery pack 3 has an ID generator 2. This example of detecting the correct remaining battery power can apply to an electronic apparatus having only one battery or more than one batteries in the battery pack. Also, the IDs can be attached either to the battery or to the battery pack. A bar code can be attached to the ID generator 2. The ID reader 5 reads the bar code or other ID of the battery pack 3 set in the battery pack. A read only memory in the battery pack 3 may also be used as the ID generator 2. When a read only memory storing the battery IDs is attached to the battery pack, the content of the read only memory is electrically read by the ID reader 5.

The battery IDs can also be set to the ID generator 2 by a dip switch. Turning the dip switch to on or off sets the battery ID, which, in turn, is read by the ID reader. It is also possible to implement the ID generator by modifying the shape of the battery. The ID reader reads the battery ID by reading the modification of the battery's physical shape.

Another example is to print a specified pattern to be read by the ID reader on the surface of the battery or battery pack. Patterns electrically connect or disconnect electric terminals like those used to identify the type of a film for a camera, or patterns that can be read by an optical character reader (OCR).

Batteries and battery packs can be either cylindrical, rectangular, or a thin plate shape. Batteries can be a disposable dry element cell or a rechargeable storage type.

As stated above, physical, electronic, or optical methods can be applied to the ID generator 2 and to the ID reader so long as the method serves to indicate and to read the battery IDs.

When the electronic apparatus with a battery pack is turned on (step S1), the ID reader 5 reads the battery ID provided from the ID generator 2 of the battery pack 3.

Then at step S3, the CPU 6 retrieves the battery information memory 7 according to the battery ID read by the ID reader 5. If the battery ID has not been registered, it is registered in the battery information memory 7 at step S4. The time when the electronic apparatus is powered on according to as measured by a timer of the electronic apparatus is stored in the battery information memory. This is done in both cases, e.g., when the battery ID of the attached battery pack 3 has already been registered and when the battery pack 3 is newly registered at step S4. Then, power on processing for the electronic apparatus completes.

FIG. 3 (b) shows the steps of powering off an electronic apparatus. This operation is performed at the time of indication of power off until the supply of power is actually stopped, which is in this figure indicated at step S15, When power is turned off at step S11, processing from steps S12 through S14 are carried out before the power supply is stopped. At step S12, the power off time as measured by the timer in the electronic apparatus is set in the battery information memory. Then, by subtracting the on time from the off time, the actual consumption hours of the electronics apparatus (or of the battery for that session) is calculated. At step S14, the calculated consumption hours are added to the accumulated consumption hours. As shown in FIG. 2, the consumption hours are updated and the accumulated consumption hours of the battery are stored.

The remaining power detector 8 detects the remaining battery power according to the accumulated consumption hours. Assuming that a battery can last for 8 hours, for example, and the accumulated consumption hours are one hour and a half, as shown in FIG. 2, then the battery can be used for 6 hours and a half more. The display unit outputs this result to the output device such as the CRT or a printer.

The flowchart in FIG. 4 shows how the remaining battery power of an electronic apparatus is detected at a given time. The remaining battery power can be detected at specific times or upon a user's request. Or, it can be detected at a set interval, e.g., at every other minute or in ten minutes and so on. The remaining power is displayed in a specified area, such as on the top or bottom line on the CRT screen.

When a request to detect the remaining power is issued to the remaining power detector 8, an operation (S201) starts. First, the accumulated consumption hours in the battery information are read at step S202. Then, the power on time in the battery information is also read at step S203. After current time is obtained from the timer at step S204, the difference between the current time and the power on time is calculated at step S205 to find the consumption hours. At step S206, The consumption hours obtained is added to the accumulated consumption hours read at step S202 to find the accumulated consumption hours up to this point. At step S207, the accumulated consumption hours obtained at step S206 is subtracted from the known possible battery running hours to detect the possible running hours left, which is then output at step S208.

The ID generator is set in the exchangeable battery, and the ID reader is set in the electronic apparatus. When the electronic apparatus is powered on, the ID reader reads the ID of the exchangeable battery and refers to the IDs in the battery information memory. When the ID is found in the memory, the power on time of the electronic apparatus is written in the battery information memory. When the ID is not found, it is registered anew and the power on time of the electronic apparatus is written in the battery information memory.

When the CPU reads the above information, the remaining power detector detects the remaining battery power, which in turn is displayed on the display unit.

The electronic apparatus according to the present Invention can indicate the remaining battery power by storing the battery consumption hours in the memory for each ID read from the battery for which an ID has been registered. When a battery is exchanged, the battery's ID is newly registered, based on which the consumption hours are to be updated.

Therefore, correct consumption hours are detected and the remaining power can be indicated, even when batteries have been exchanged. Although the remaining battery power can be detected by subtracting the consumption power from the charged capacity, consumption power is calculated from the consumption hours in this way by example only. Another valid example is to store the amount of consumption power detected by measuring the applied current and time and then integrating them. By storing consumption information, the remaining battery power can be detected at any given time while using the electronic apparatus.

In this example, when a battery having a new ID not yet registered in the memory is used, the new ID and its battery information are registered in the memory, permitting consumption hours for each battery to be calculated. Thus, an electronic apparatus can detect the remaining power from the accumulated consumption hours even when the batteries are exchanged.

In this example, an electronic apparatus can obtain the remaining battery power easily and rapidly because the remaining power is calculated from the accumulated consumption hours.

In this example, the accumulated consumption hours are obtained based on the operation hours calculated from the on and off times of a battery. Based on this accumulated consumption hours, the remaining battery power is detected and displayed. Because the accumulated consumption hours are calculated according to the battery IDs, the electronic apparatus can obtain the correct remaining battery power, even when the battery is new or exchanged.

In this example, when an ID is not registered, it is registered in the battery information memory, thus enabling the electronic apparatus to detect the remaining battery power even when the battery is new.

In this example, while an electronic apparatus is in use, the correct remaining power can be output at any given time because the accumulated consumption hours up to that particular time can be calculated.

Embodiment 2

Figure 5:
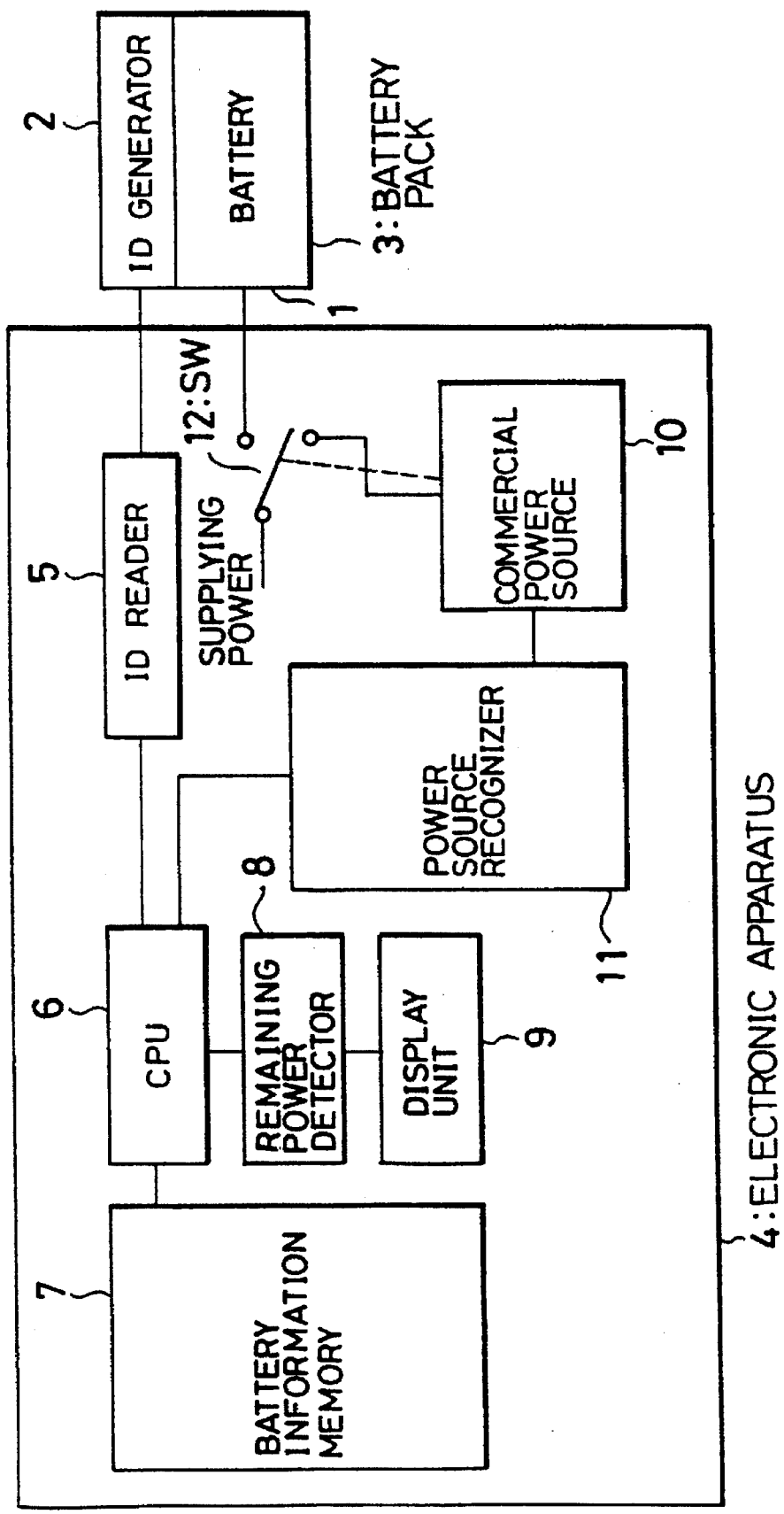
FIG. 5 shows an example of electronic apparatus using this invention.

FIG. 5 illustrates another example of using an electronic apparatus according to the present invention. In the Figure, the commercial power source 10 may run at VAC 100. The power source recognizer 11 detects whether power is applied from the commercial power source or from battery pack 3. The switch 12 switches power from the commercial power source 10 to the battery pack 3 and vice versa.

This is an example of using both commercial power source 10 and battery pack 3 with the switch 12. When the electronic apparatus 4 uses the commercial power source 10, the power of battery 1 of the battery pack 3 is not consumed. The information stored in the battery information memory 7, therefore, is not to be updated.

Figure 6:
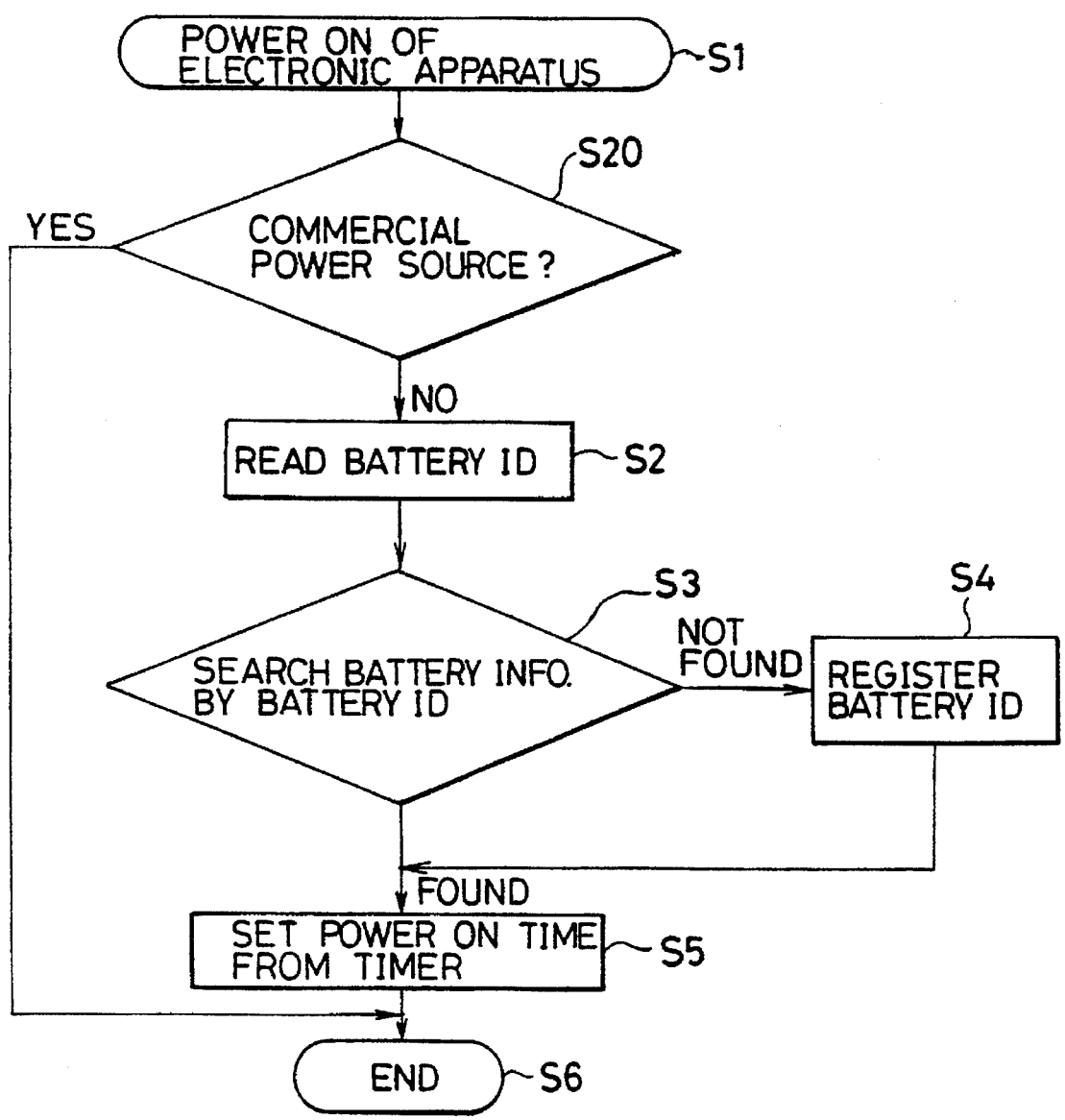
FIG. 6 is an operational flowchart of an electronic apparatus according to the present invention.
Figure 7:
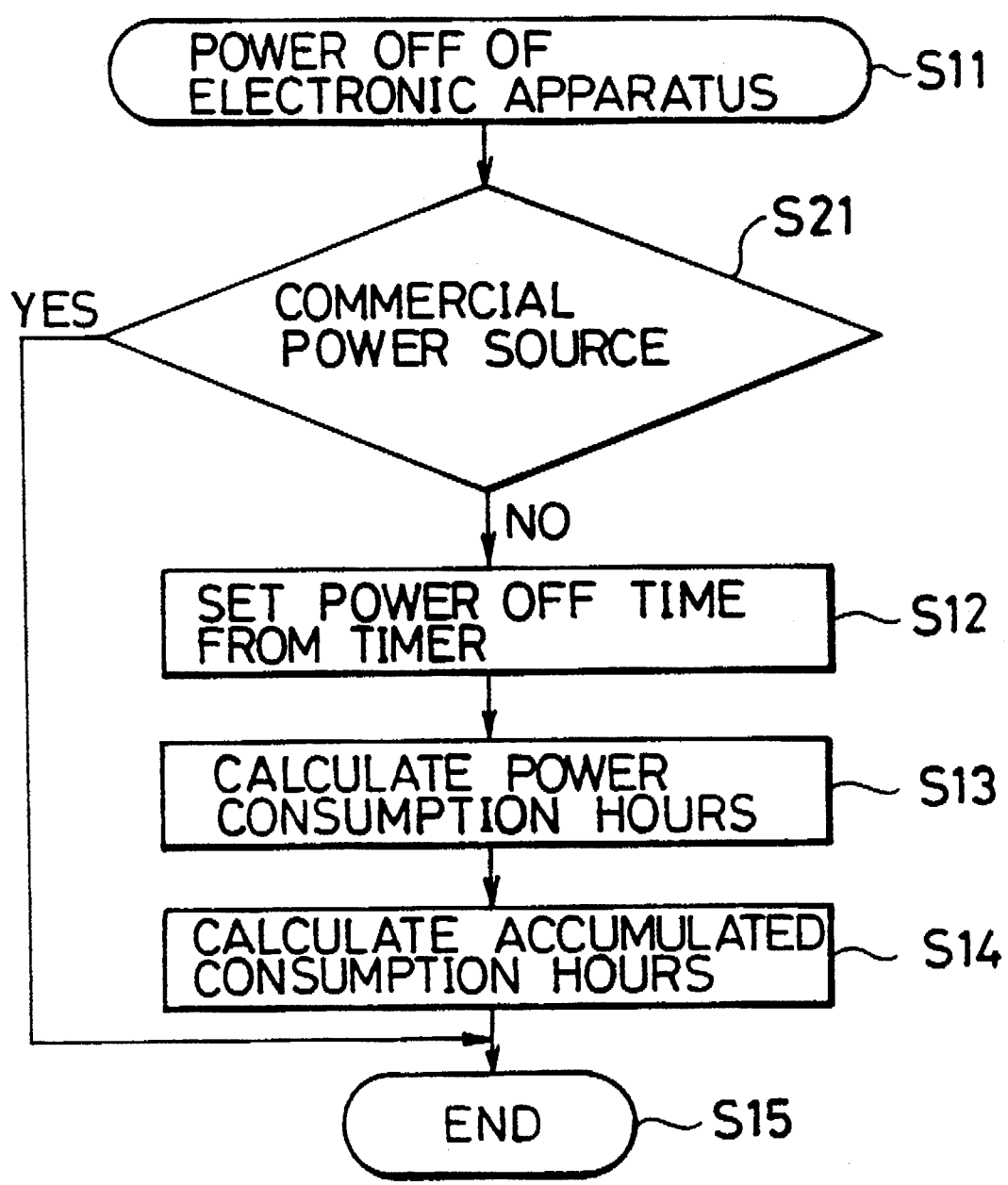
FIG. 7 is an operational flowchart of an electronic apparatus according to the present invention.

FIGS. 6 and 7 show operation of the invention when a commercial power source is used. FIG. 6 corresponds to FIG. 3, and FIG. 7 corresponds to FIG. 4. FIGS. 6 and 7 can be differentiated from FIGS. 3 and 4 in that at step S20, If the power source detected by the power source recognizer 11 is commercial, processing from step S2 through step S5 are skipped. Also, if the power source recognizer 11 detects the commercial power source at step S21, operation ends without performing processing from step S12 through step S14 as shown in FIG. 7. The remaining battery power is always detected correctly because the content in the battery information memory is not affected regardless of whether the electronic apparatus is powered on or off when a commercial power source is applied.

In the above example, when the electronic apparatus is powered on, the power source recognizer detects whether the applied power is commercial or battery. When the battery power is detected, the ID reader in the electronic apparatus reads the information from the ID generator in the exchangeable battery and refers to the battery ID in the battery information memory. If the ID is found in the battery information memory, the power on time of the electronic apparatus is written in its record. When the ID is not found, it is newly registered, and the power on time of the electronic apparatus is written in the battery information memory. When the CPU reads the above information, the remaining power detector detects the remaining battery power, which, in turn, is displayed on the display unit.

In the above example, consumption hours are added only when the battery power is used, thereby enabling the electronic apparatus to correctly display the remaining battery power when both the battery and commercial power source are available.

Embodiment 3

Figure 8:
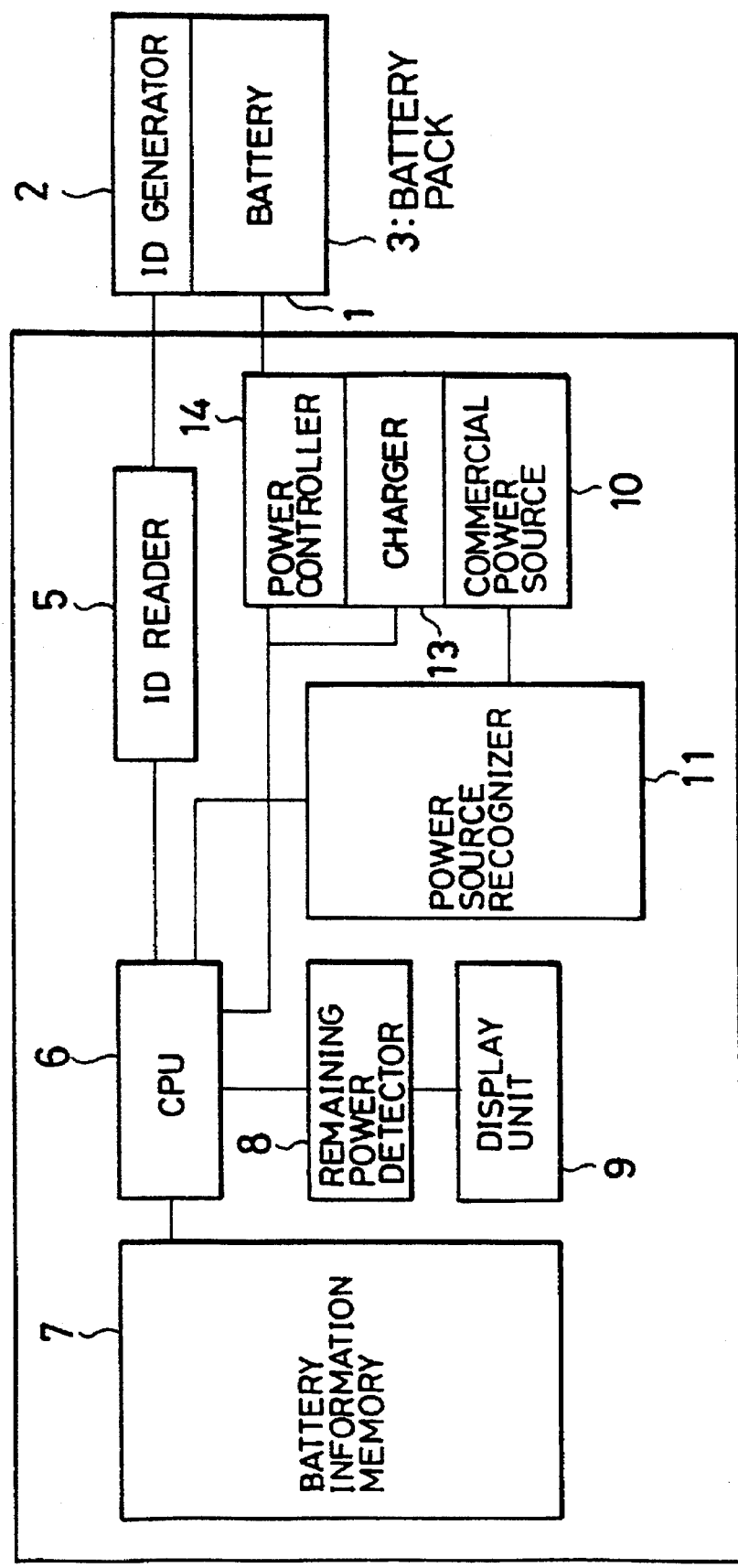
FIG. 8 shows an example of an electronic apparatus according to the present invention.

FIG. 8 shows one example of using an electronic apparatus according to the present invention. In FIG. 8, charger 13 charges battery 1 attached in the battery pack 3. Power controller 14 controls the supplying of power from the battery 1 or the charging of power to the battery 1 from the charger 13. When the battery 1 is fully charged from the charger 13, the power controller stops the charging. The power controller 14 is assumed to have a capability of knowing when a battery becomes fully charged by supplying a specified charge current for a specified charge time. This example is characterized in that the electronic apparatus is provided with a charger and that the charge information is included in the battery information in the battery information memory for charging battery 1.

In embodiments 1 and 2, either dry cell or storage batteries can be used. In this example, however, storage batteries are used to accommodate the charger.

FIG. 9 shows an example of battery information memory having stored the charge information, which records the charge on time, the charge off time, and the charged rate. The charge on time is the time when the battery 1 starts to be charged from the charger 13, and the charge off time is the time when charging of the battery 1 is terminated. The charged rate, which represents the time actually spent for charging in proportion to the time required for full charging, is obtained by the following equation:

$$\text{The charged rate (\%)} = (\text{charged time / time required for full charge} \times 100).$$

The reasons the charger 13 stops charging the battery 1 are twofold; one is when the power controller detects the battery 1 has been charged fully, thus charging is no longer necessary. The other reason is when the power supply to the charger 13 is forcibly terminated as power from the commercial power source 10 is stopped.

FIG. 9 explains an operation when a battery becomes fully charged in an hour. As is indicated in FIG. 9 (a), a battery is charged for an hour. The power controller 14 detects the fully charged state. When the charger 13 has charged the battery 1 fully, the charged rate becomes 100%, at which point the accumulated consumption hours are cleared. In this example, the accumulated consumption hours stored as one hour and a half are cleared when the rate has reached 100%.

The charged rate does not reach 100% if the charger terminates charging due to the termination of power supply from the commercial power source 10.

Because the power controller knows that a battery becomes fully charged when a specified current is applied for a specified time period, the charged rate can be obtained even when power to the battery is terminated halfway.

If, for example, it requires one hour to charge a battery, and a battery is charged for half an hour, e.g., from 10:00 to 10:30 as shown in FIG. 9 (b), the charged rate will be detected as 50%. When the charged rate does not reach 100%, the accumulated consumption hours are not cleared.

Running hours can be predicted based on the charged rate. i.e., in this case 50%, to update the accumulated consumption hours. If a fully charged battery can be used for 10 hours and its charged rate is indicated as 50%, the running hours can be detected as 5 hours, thus the accumulated consumption hours are 5 hours. As shown in FIG. 9 (b), the accumulated consumption hours is updated from 6 hours and 32 minutes to 5 hours.

In this embodiment, an ID generator is attached to an exchangeable battery, and the ID reader is attached to the electronic apparatus. When the electronic apparatus is powered on, the ID reader reads the ID of the exchangeable battery and refers it to the battery IDs in the battery information memory. When the ID number is found, the power on time of the electronic apparatus is written in the battery information memory. If the ID number is not found, it is newly registered and the power on time is written in the battery information memory.

When a battery is fully charged from the charger, the charge information is written in the battery information memory. When the CPU reads the above information, the consumption information and charge information are calculated to obtain the remaining battery power, which is then displayed on the display unit.

When an electronic apparatus is provided with a charger, the consumption information is updated based on the accumulated consumption hours and charge hours to obtain the remaining power, thereby enabling the apparatus to correctly indicate the remaining battery power.

Embodiment 4

Figure 10:
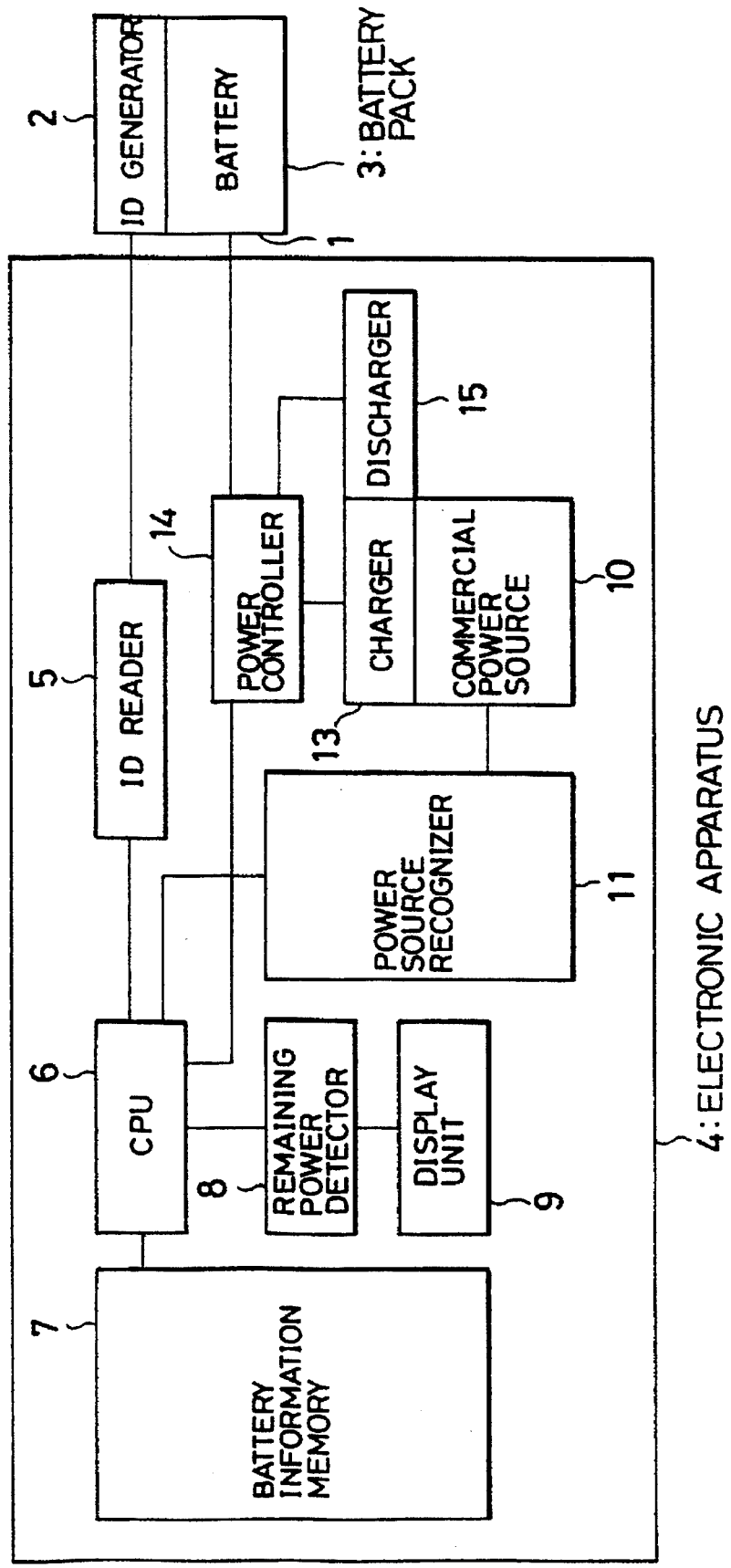
FIG. 10 shows an example of an electronic apparatus according to the present invention.

FIG. 10 shows an example of an electronic apparatus according to the present invention.

The discharger 10 discharges power from the battery 2. In this example, the battery 2 of the battery pack 3 becomes fully charged by the charger 13 only after it is discharged by the discharger 15.

In previously described embodiments, the remaining battery power determined from the consumption hours could be incorrect because the capacity level of the battery 2 in the battery pack 3 cannot be known. Although the remaining battery power can be correctly detected based on the consumption hours after the battery 2 is fully charged, when an electronic apparatus is provided with a charger, there is no telling whether or not a battery of the battery pack is fully charged, when the battery pack is initially attached. Thus, sometimes the remaining battery power displayed at the initial stage of the operation is incorrect. In this example, however, the remaining battery power can be correctly obtained from the consumption hours because the battery is discharged by the discharger 15 before being fully charged from the charger 13.

In this embodiment, an ID generator is attached to exchangeable batteries, and the ID reader is attached to the electronic apparatus. When the electronic apparatus is powered on, the ID reader reads the ID of the exchangeable battery and refers it to the battery IDs in the battery information memory. When the ID number is found, the power on time of the electronic apparatus is written in the battery information memory. If the ID is not found, it is newly registered in the battery information memory. Before the electronic apparatus starts to operate, the battery is discharged once and then charged fully. The time when the battery has become fully charged is written as the power on time of the electronic apparatus, and the charge information is written as being fully charged. When the CPU reads the above information, the consumption information and charge information are calculated to obtain the remaining battery power, which is then displayed on the display unit.

In this embodiment, because a battery is discharged once by the discharger before being fully charged, it becomes possible to use any state of storage batteries. Thus, the remaining battery power can be detected according to the consumption hours from the fully charged state and correctly indicated.

Embodiment 5

FIG. 11 represents another example of an electronic apparatus according to the present invention, in which the charge unit 21 is attached in the charger 20, the ID reader 22 reads battery IDs from the ID generator 1, and the charge information memory 23 stores the battery charge information for each battery read by the ID reader 22. Line 24 connects the electronic apparatus 4 with the charger 20. The CPU 25 reads the battery ID by activating the ID reader 22 and sends the charge Information stored in the charge information memory 23 to the electronic apparatus 4 via line 24. Commercial power source 26 supplies power to the charge unit 21.

Most chargeable batteries are charged by a separate charger. This example is used to explain how to correctly display the remaining battery power on the electronic apparatus 4 even when a battery is charged by a separate charger 20. The ID reader 22 of the charger 20 reads the battery ID from the ID generator under the control of the CPU 25 and stores it in the charge information memory 23. Under the control of the CPU 25, the charge information from the charger 21 is stored for each battery ID in the charge information memory 23.

FIG. 12 shows examples of items in the charge information memory and the battery information memory. The charged date and the fully charged time are stored for each battery ID in the charge information memory 23. In addition to the items included in the previously shown battery information memory, the operation date, e.g., the most recent date on which the battery is consumed, is added to the battery information memory 7. Furthermore, the charged date and the fully charged time transferred from the charge information memory 23 via line 24 are also stored.

In FIG. 12 (a), the charged date and the fully charged time are stored for the battery having an ID "BT01" FIG. 12 (b) indicates the status in which the charged date and fully charged time of the battery BT01 are transferred to the electronic apparatus via line 24 and stored in the battery information memory 7. The last running date and the off time for the battery identified as BT01 can be known by referring to the running date and the off time in the battery information memory.

If the charged date and fully charged time sent from the charger are more recent than the above, accumulated consumption hours are to be cleared.

The remaining battery power can be correctly displayed when a battery is attached to the electronic apparatus 4 after being fully charged by the charger 20 as the CPU 25 transfers the charge information to the battery information memory via line 24 to update the battery's accumulated consumption hours.

Figure 13:
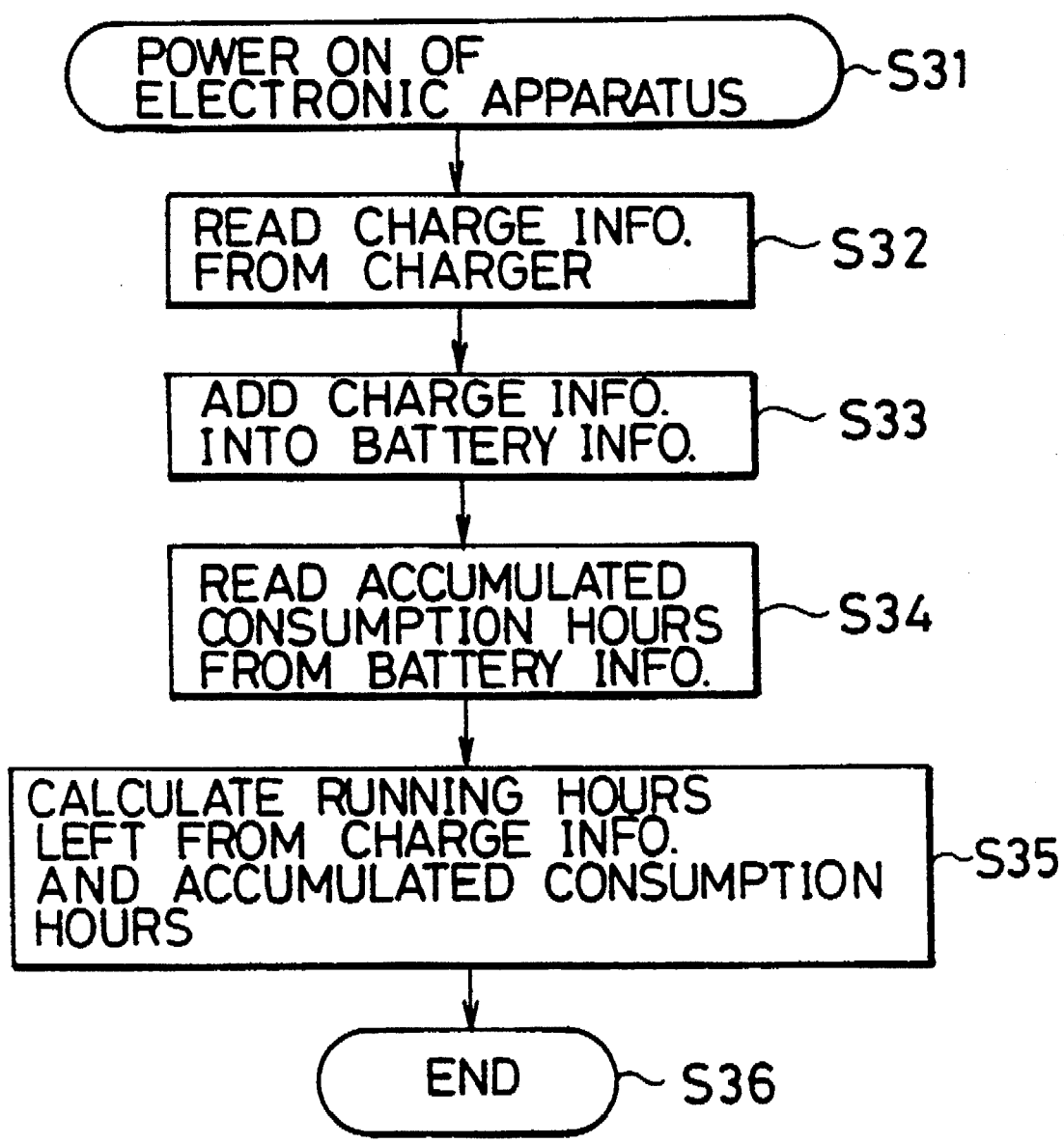
FIG. 13 is an operational flowchart of a battery management system according to the present invention.

FIG. 13 is an operational flowchart of this example. When the electronic apparatus is powered on at step S31, the electronic apparatus 4 reads the charge information in the charger via line 24 at step S32, which is then added to the battery information at step S33. The consumption hours are read from the battery information memory at step S34. Then the accumulated consumption hours are updated based on the charge information and accumulated consumption hours at step S35, with which the remaining battery power is calculated and stored in the battery information memory.

When the electronic apparatus 4 uses one of the batteries charged by the charger 20, the information of the battery is read according to its ID from the battery information memory, based on which the remaining battery power is calculated and displayed.

In this embodiment, the electronic apparatus storing the battery information and the charger are separate. When the charger, in which the battery ID and the charge information are stored, is connected to the electronic apparatus, the information in the charger is read into the electronic apparatus.

In this example of battery management system, in which the charger and the electronic apparatus are separate, they are connected so that the charge information in the charger is transferred to the electronic apparatus to obtain the remaining battery power. The electronic apparatus can tell the charged level of a battery when it receives the charge information. The remaining power of a battery attached to the electronic apparatus can be correctly displayed even when the charger and the electronic apparatus are separate as the charge information is transferred.

Embodiment 6

The previously given example shows that the charge information includes storing charged date and the fully charged time. FIG. 14 shows another example of making up the charge information. It includes charge on time, charge off time, charged date, and a full charge flag. The charge on time and off time in this figure indicate the time when the charger 20 is turned on and off. The full charge flag is set on when a battery is fully charged. The charge on and off times can be transferred only when this flag is off, Although it is preconditioned that batteries are fully charged by the charger 20 in embodiment 5, embodiment 6 represents a case in which a battery to be used may not necessarily be fully charged.

If the full charge flag is on, the battery is considered to be fully charged just as in the previous example.

When the full charge flag is off, the battery's charged rate is predicted based on the charge on and off times. The accumulated consumption hours may be updated and the remaining battery power can be surmised based on this predicted value.

Embodiment 7

Figure 15:
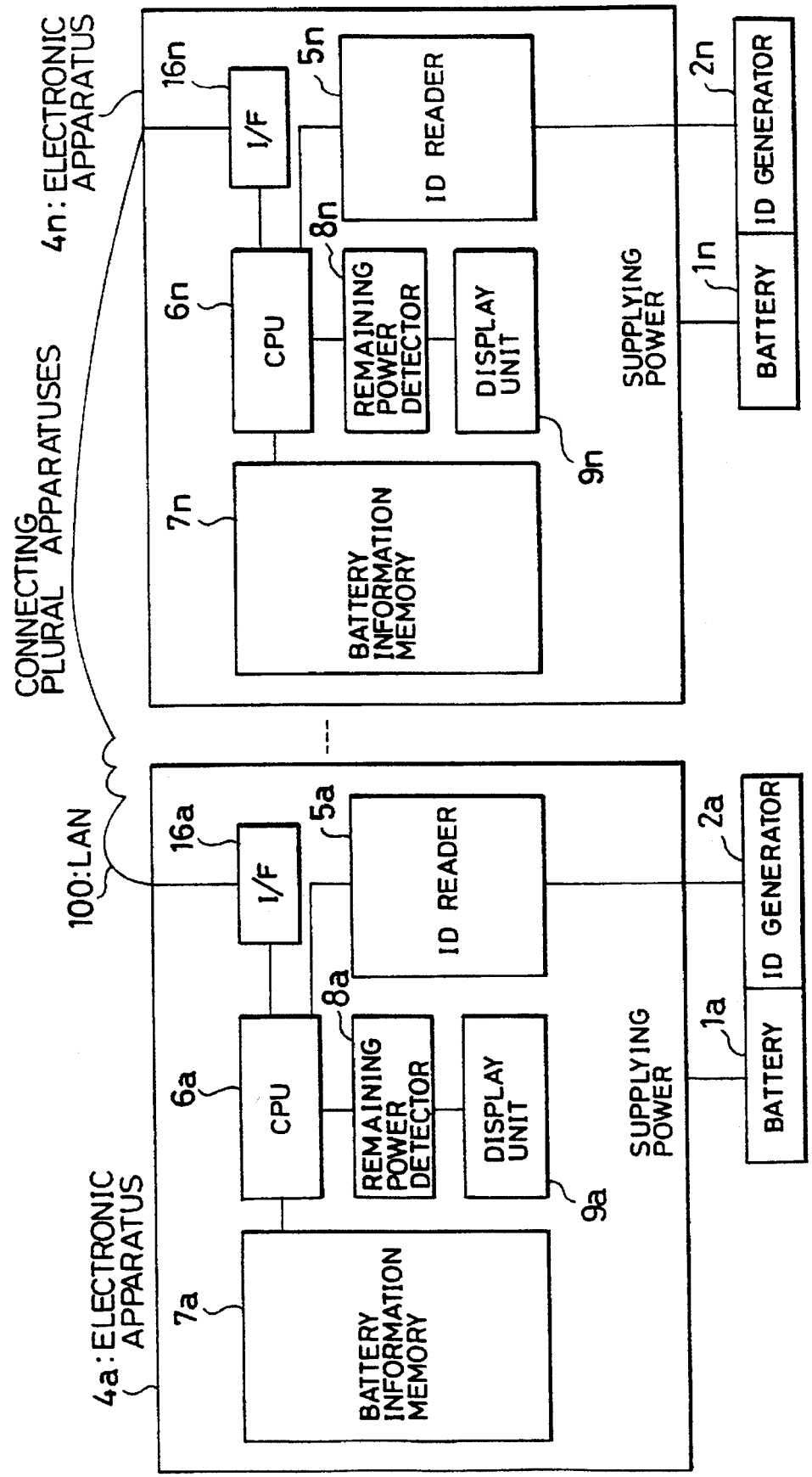
FIG. 15 is a battery management system according to the present invention.

FIG. 15 shows one example of battery management system according to the present invention. In this figure, electronic apparatuses 4a through 4n are employed, e.g., more than one apparatus is used. Local area network 100 connects those multiple electronic apparatuses and the local area network interfaces 16a through 16n are installed inside the electronic apparatuses 4a through 4n.

Figure 16:
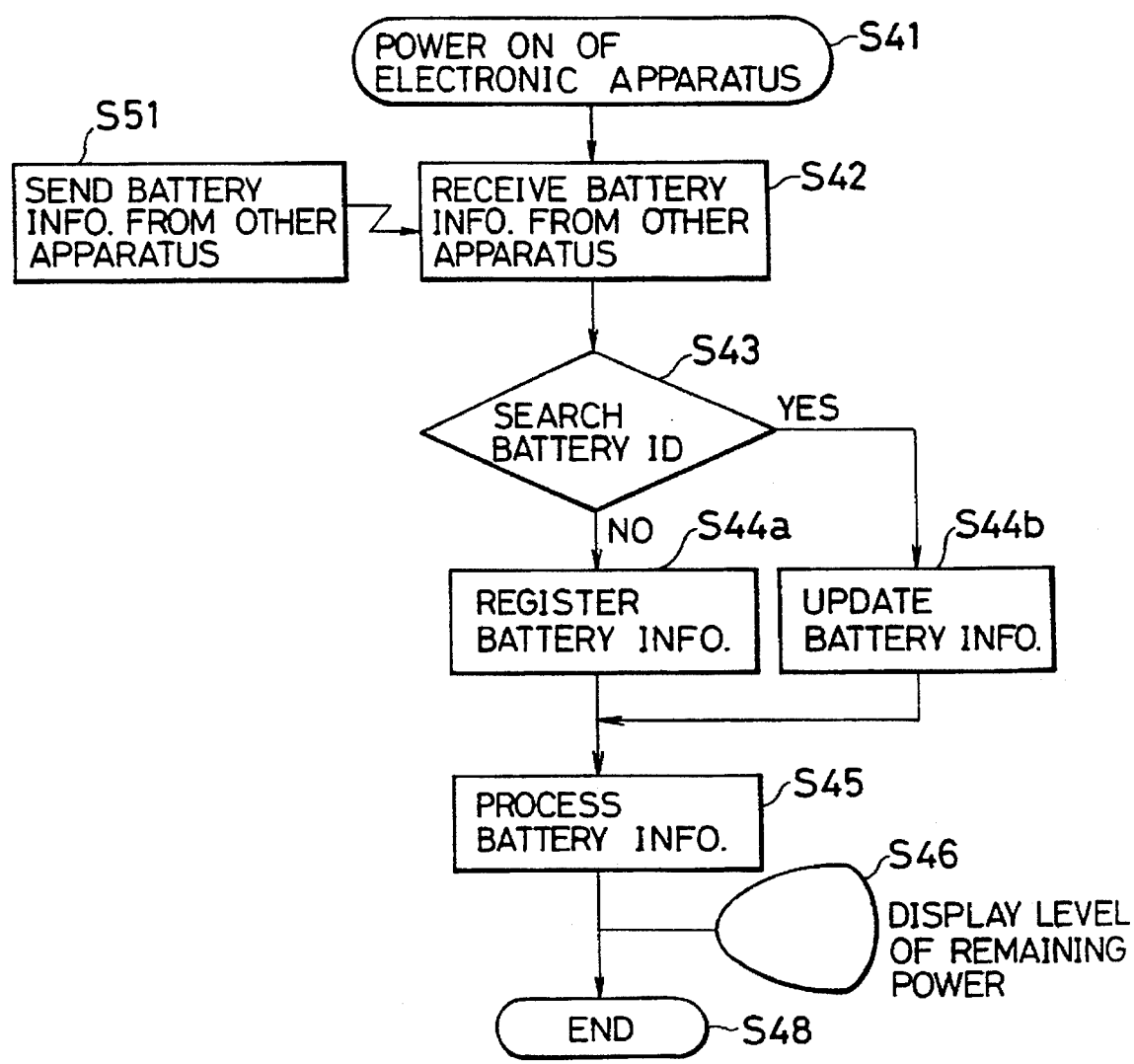
FIG. 16 is an operational flowchart of a battery management system according to the present invention.

FIG. 16 is an operational flowchart of this example. Steps S41 through S48 show the sequence of operations when an electronic apparatus is turned on, and step S51 indicates the operation of any other electronic apparatuses that have been already on.

When an electronic apparatus is powered on (S41), the battery information of other electronic apparatuses received from step S51 is read at step S42.

Upon being powered on, the electronic apparatus references the battery information memory according to the transferred battery ID. If the ID is not found in the battery information memory. It is newly registered and used to obtain new battery information from other electronic apparatuses, and the new information is registered in the battery information memory. When the battery ID is in the battery information memory, the battery information in it is updated based on the new battery information obtained from other electronic apparatuses.

The electronic apparatus then calculates the remaining power of the attached battery based on the latest battery information obtained at step S45. An electronic apparatus can calculate remaining power of batteries attached to other electronic apparatuses as well as those attached to itself using the previously mentioned equation. The electronic apparatus can display the result of calculation at step S46 either for itself or for other electronic apparatuses.

Figure 17:
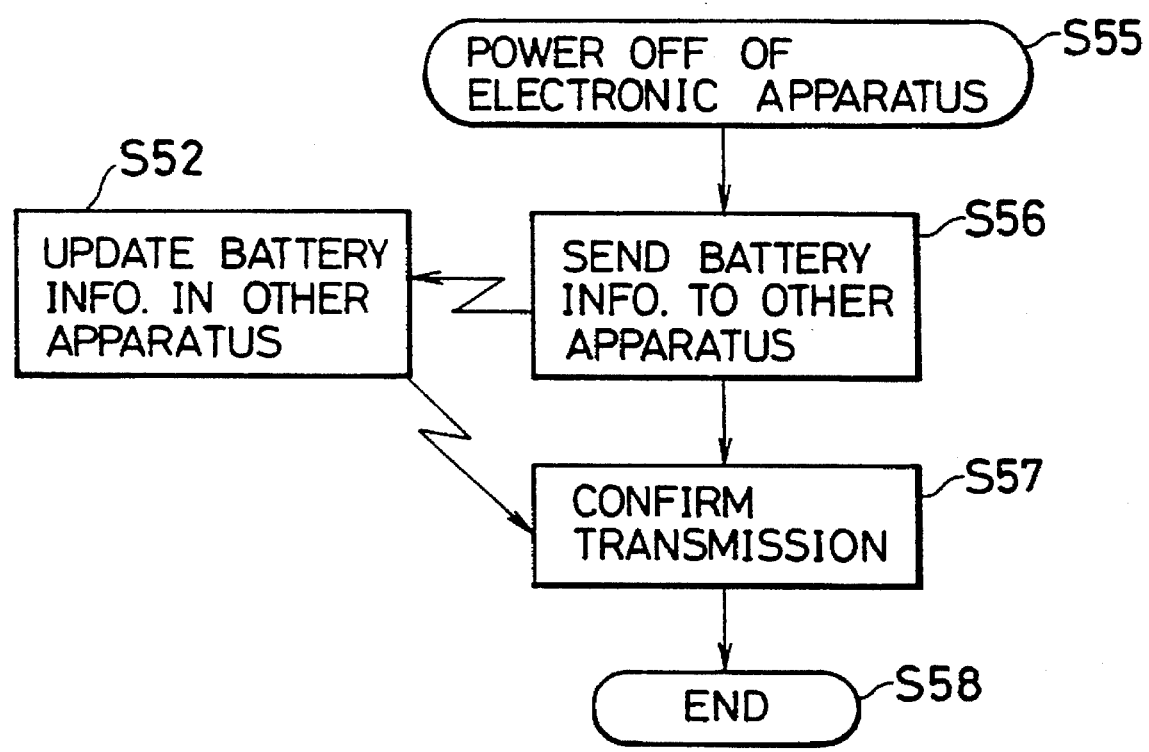
FIG. 17 is an operational flowchart of a battery management system according to the present invention.

FIG. 17 is an operational flowchart of an electronic apparatus at power off. After the electronic apparatus is turned off, it is when the operational sequence ends that the actual power supply is terminated.

When an electronic apparatus is turned off, the battery ID and its information are transferred to other electronic apparatuses. In FIG. 17, the battery information of this electronic apparatus is transferred to other electronic apparatuses at step S56, where the battery information is to be updated at step S52 for each ID. This enables each electronic apparatus to retain the latest battery information through transferring of IDs and their information when an electronic apparatus is powered off.

The content of the battery information is checked upon its transfer and the sequence of operations ends when the content proved true.

The latest battery information is exchanged and shared among multiple electronic apparatuses each time an electronic apparatus is powered off.

Figure 18:
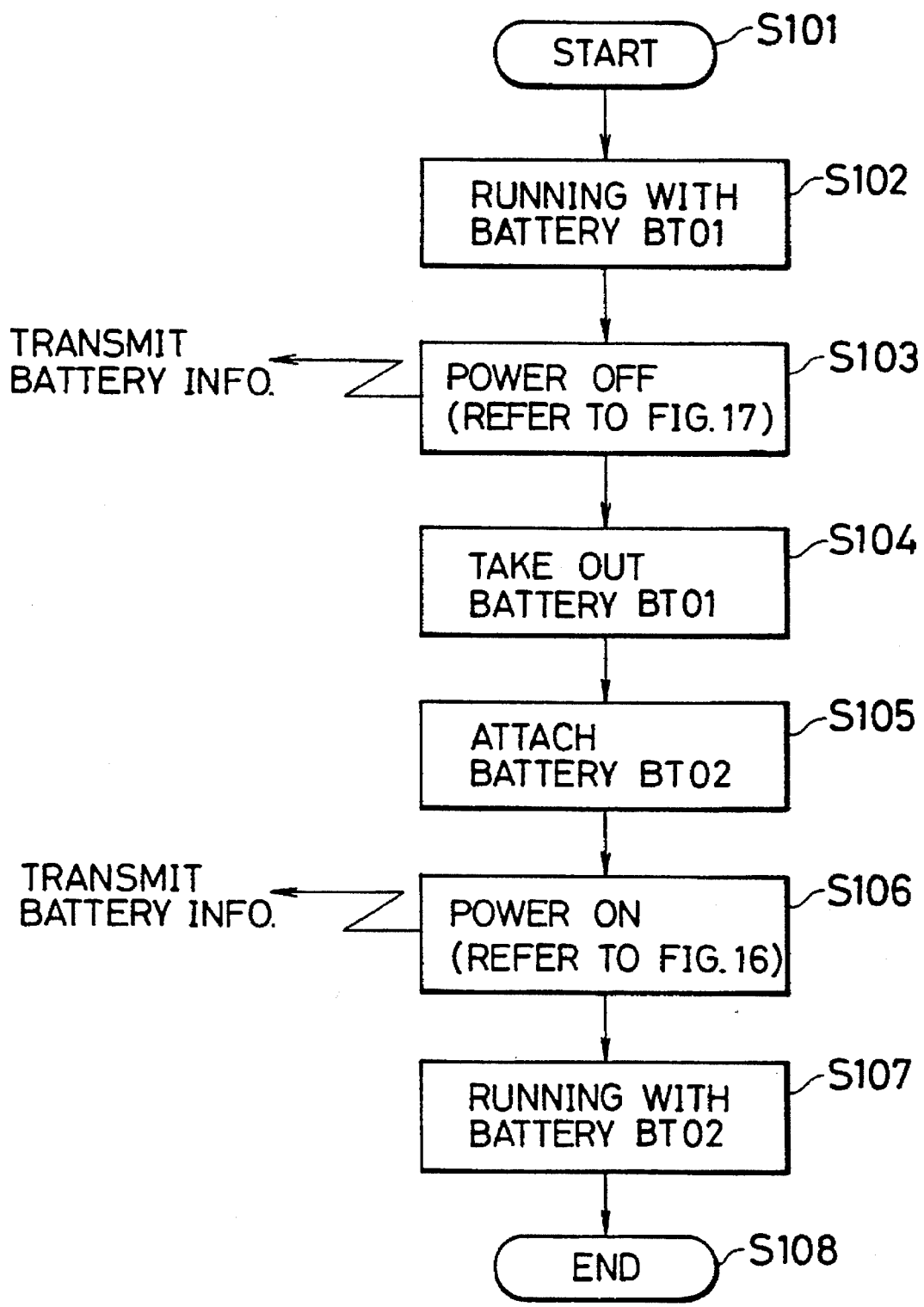
FIG. 18 is a flowchart of battery exchange of a battery management system according to the present invention.
Figure 19:
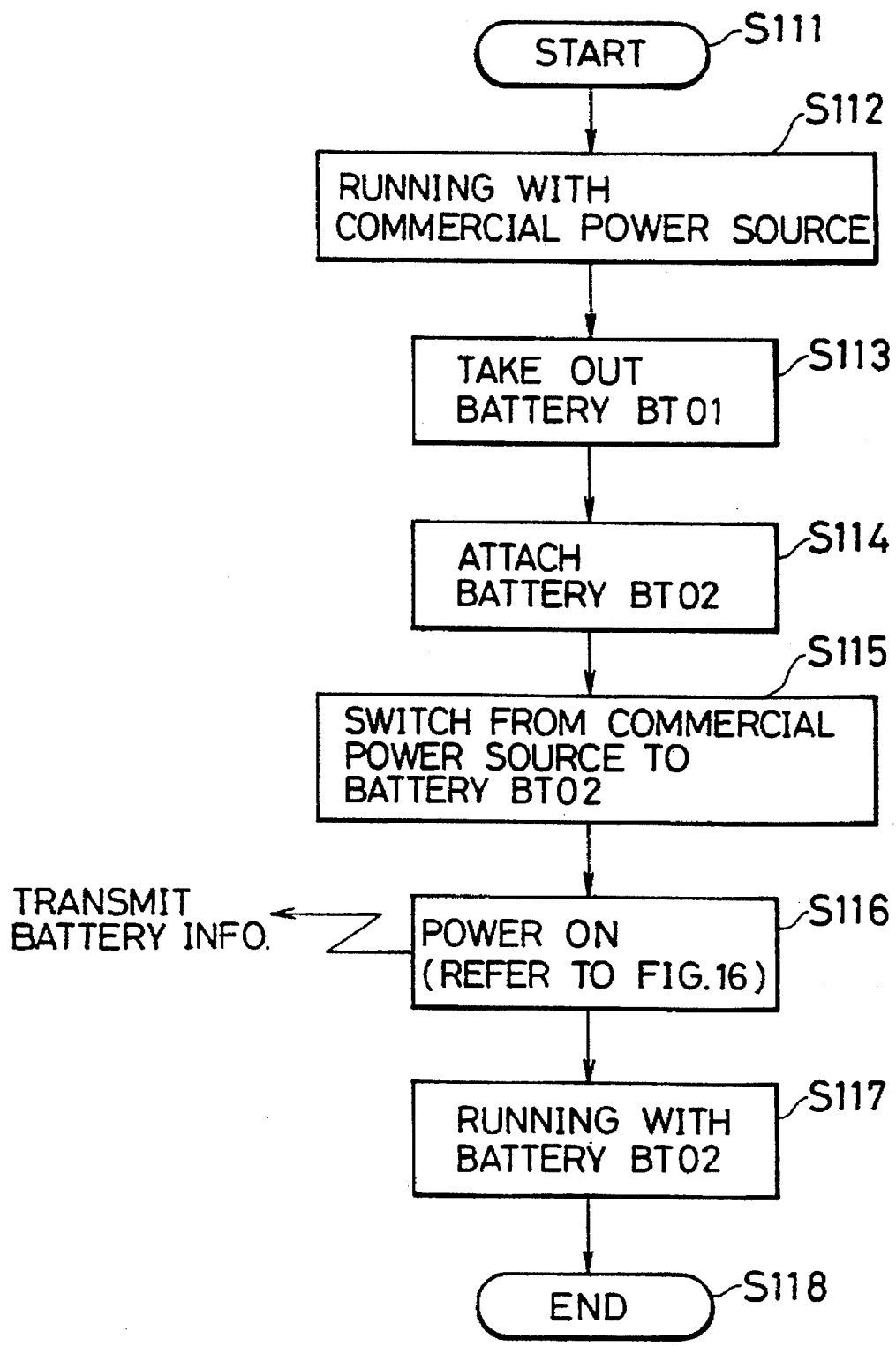
FIG. 19 is a flowchart of battery exchange of a battery management system according to the present invention.

FIGS. 18 and 19 explain how batteries are exchanged. FIG. 18 shows how a battery with an ID BT01 is to be exchanged with another battery BT02.

An electronic apparatus running on the battery BT01 (S102) is powered off (S103) according to the operational sequence shown in FIG. 17. The latest information of the battery BT01 has been transferred to other electronic apparatuses.

After the battery BT01 is taken out (S104), a new and fully charged battery (BT02) is attached to the electronic apparatus (S105). Then the electronic apparatus is powered on at step S106 and the information of the battery BT02 is transferred to other electronic apparatuses as indicated in FIG. 16. Because the battery BT02 is attached in its fully charged state, its battery information is stored as being fully charged.

When this power on operation ends, the electronic apparatus starts to run with the battery BT02 at step S107.

FIG. 19 gives an example of exchanging batteries while an electronic apparatus is running with a commercial power source. After a battery BT01 is taken out at step S113, a battery BT02 is attached to the electronic apparatus. Because batteries have been disconnected electrically, battery exchange can be done at any given time while allowing the electronic apparatus to continue its operation with commercial power source.

Power is then switched from commercial power source to the battery BT02 at step S115. When the battery BT02 starts to operate, the sequence of operation is carried out to transfer the battery information to other electronic apparatuses as is explained in FIG. 16.

Because the battery BT02 is attached in its fully charged state, the battery information in all electronic apparatuses is updated as being fully charged.

After the battery information has been transferred, the electronic apparatus starts to run with the battery BT02.

Figure 20A:
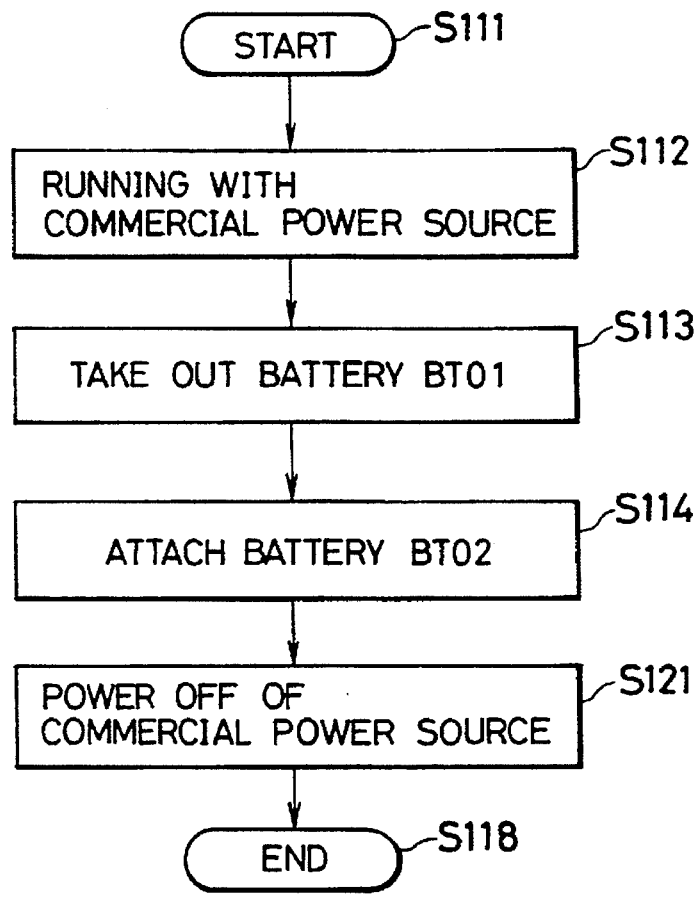
FIG. 20 is a flowchart of battery exchange of a battery management system according to the present invention.
Figure 20B:
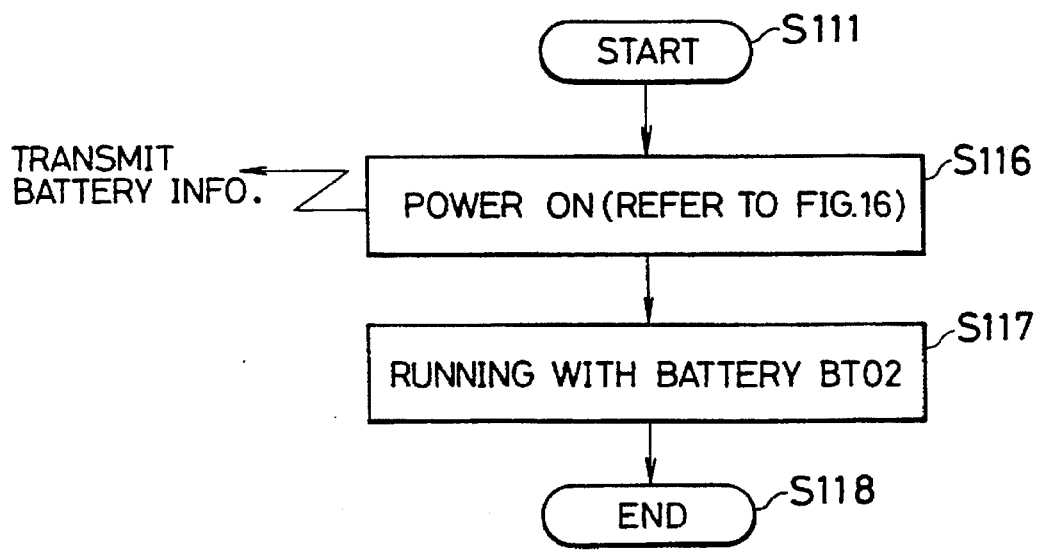

Another example of battery exchange is shown in FIG. 20. In FIG. 20 (a), while an electronic apparatus is running with commercial power source, a battery BT01 is exchanged with a battery BT02, after which the electronic apparatus is once turned off. Because the electronic apparatus is running with commercial power source, batteries can be exchanged at any time. Also, the battery information is not updated nor transferred as the batteries have not been in use. FIG. 20 (b) shows a sequential operation in which the electronic apparatus is powered on (S116) after a battery BT02 is newly attached.

The information of the battery BT02 is transferred to other electronic apparatuses as shown in FIG. 16. Then the battery BT02 enters an operating state at step S117.

The information of the taken battery BT01 is saved in the battery information memory of the electronic apparatus, thus retaining the power off state of the battery.

The execution of power on and off operations shown in FIGS. 16 and 17 enables all electronic apparatuses to share the latest battery information even after batteries are exchanged.

With multiple electronic apparatuses being connected via line, an electronic apparatus storing the battery information collects and updates the battery information for each ID of other electronic apparatuses and then transfers the information to other electronic apparatuses, thus allowing all electronic apparatuses to share the same latest battery information.

As has been explained, two or more electronic apparatuses exist in this example. Because the electronic apparatuses transfer and share the information of all batteries based on their IDs, an electronic apparatus has been provided with the information of a battery even when the battery had been previously used for another electronic apparatus. Thus, this battery management system can correctly display the remaining battery power.

The battery management system in this example is connected via multiple lines in the local area network, through which battery information can be easily transferred.

Embodiment 8

In the previous embodiment, because power source information is exchanged only when an electronic apparatus is powered on or off, the battery information is not updated as long as an electronic apparatus is in use.

Figure 21:
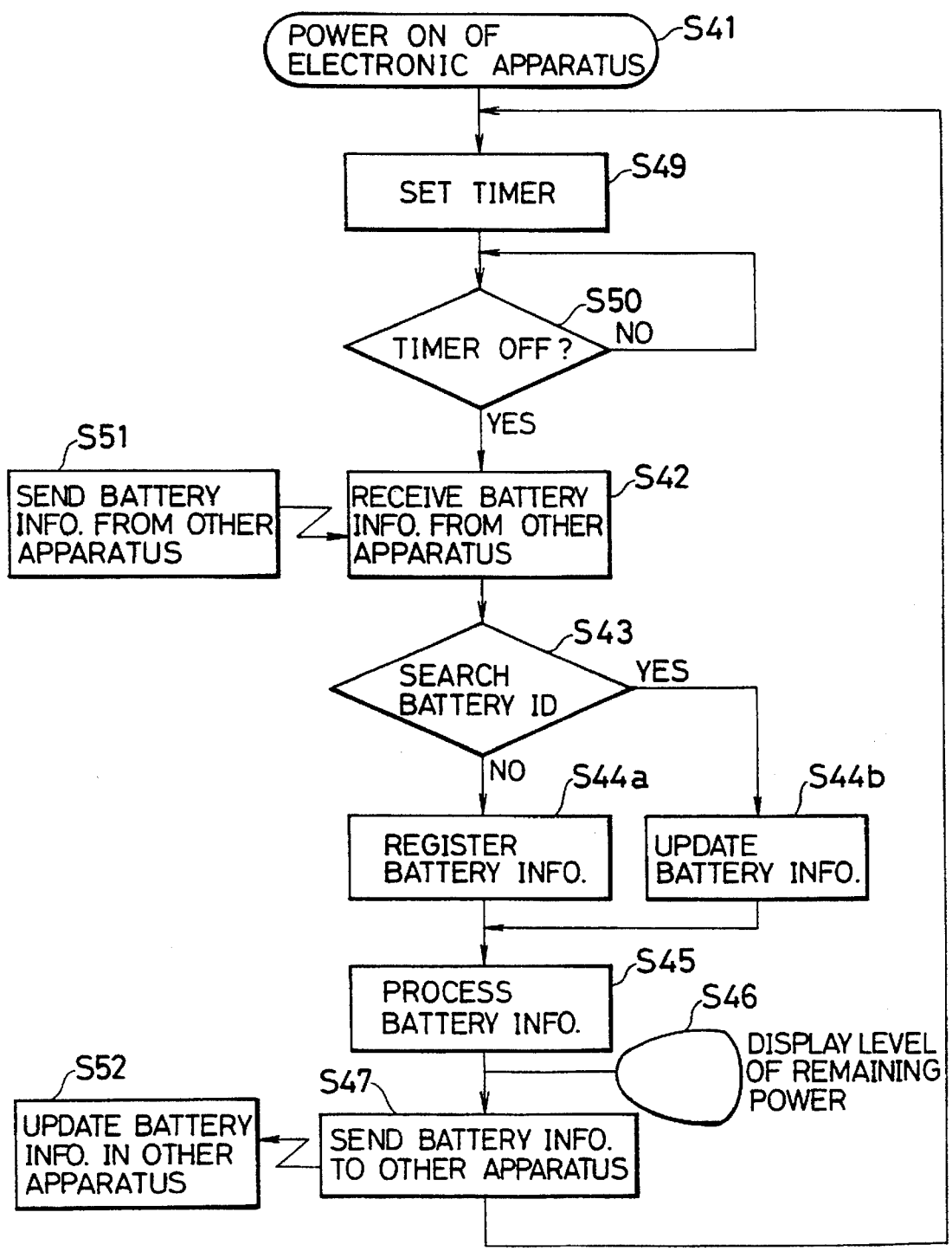
FIG. 21 is an operational flowchart of a battery management system according to the present invention.

Thus, battery information in this example is designed to be transferred at a predetermined timing point. FIG. 21 differs from FIG. 16 in that steps S49 and S50 are added and that this sequence is looped until power is turned off.

A timer is set at step S49. For instance, to transfer battery information every 10 minutes, the timer is set to 10 minutes. After countdown starts, it is checked whether or not 10 minutes have passed. The sequential operation is looped for 10 minutes. When 10 minutes have passed, processing from S42 through S47 are carried out to exchange battery information, thus permitting electronic apparatuses to share the latest battery information.

The information of batteries used at the time of power off is also transferred to other electronic apparatuses. In this example, two or more electronic apparatuses storing battery information are connected via lines.

An operating electronic apparatus collects and updates battery information of each electronic apparatus via lines at a predetermined timing point. Then the operating apparatus transfers the result to have the battery information of other electronic apparatuses updated.

This battery management system transfers battery information either at the start of an electronic apparatus or at a specified timing point. When an electronic apparatus is started, the battery information is exchanged between the electronic apparatus and those other apparatuses already in operation. When data transfer is carried out at a specified timing point, the latest battery information can be shared among all electronic apparatuses connected via a network.

Embodiment 9

When remaining battery power becomes low, a battery can be exchanged with a spare or it can be charged again for reuse. When there are two or more electronic apparatuses, it can happen that batteries are attached to an electronic apparatus different from the one it had been attached to before.

Embodiment 9 presents a case in which battery information is transferred among electronic apparatuses via local area network 100 to correctly detect the remaining power when batteries are exchanged.

Figure 22:
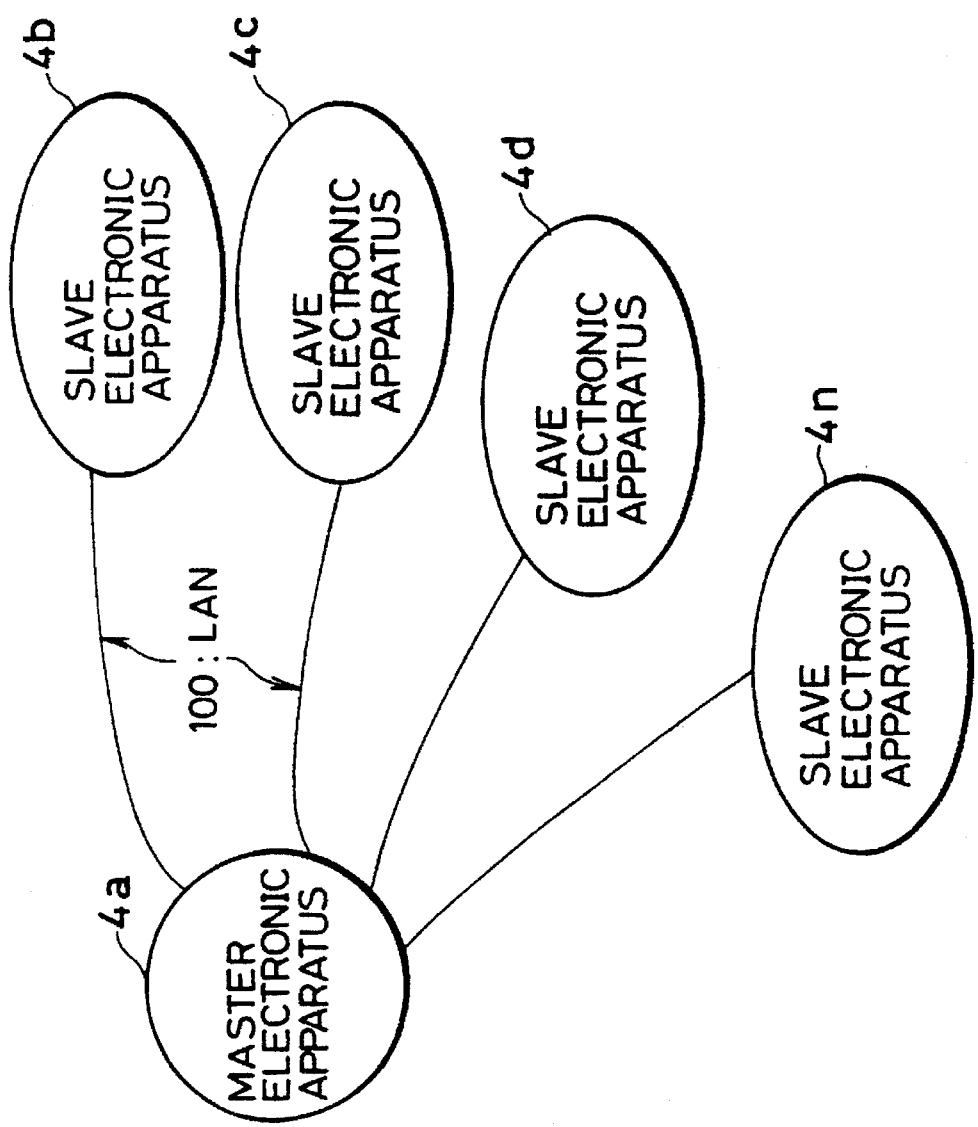
FIG. 22 is a battery management system according to the present invention.

FIG. 22 shows an example of a battery management system according to the present invention. As is shown in the figure, one of the electronic apparatuses is assumed as a master electronic apparatus. The battery information of other electronic apparatuses, or slave electronic apparatuses, is stored in the battery information memory of the master electronic apparatus.

The master electronic apparatus is assumed to start first and end last among electronic apparatuses, and is capable of collectively managing all battery information of slave electronic apparatuses and providing information regardless of the activation or deactivation of slave electronic apparatuses.

FIG. 23 shows items in the battery information memory of the master electronic apparatus.

Figure 24:
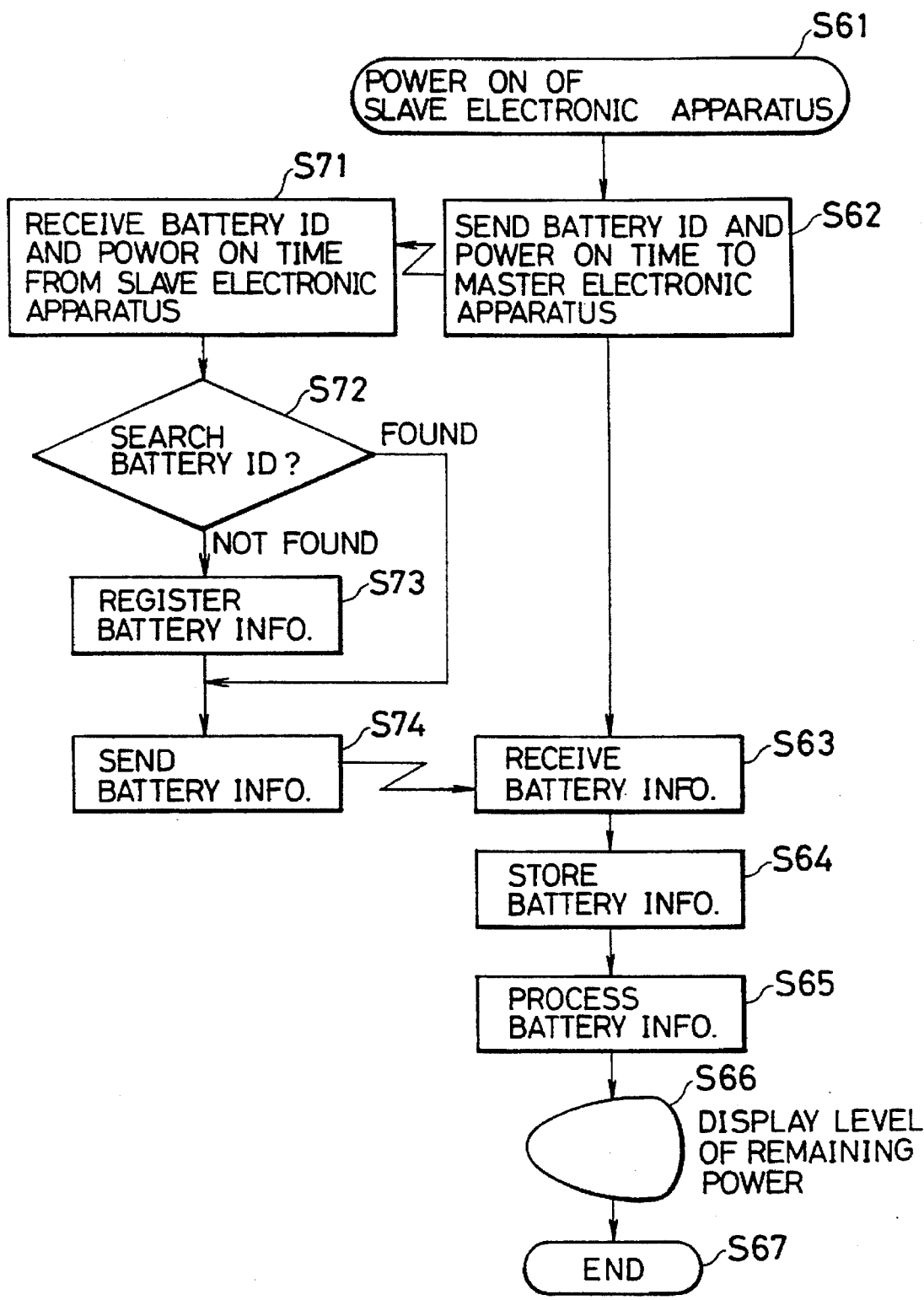
FIG. 24 is an operational flowchart of a battery management system according to the present invention.

FIG. 24 is an operational flowchart according to the present invention.

Processing from step S61 through step S67 are carried out when a slave electronic apparatus is powered on whereas those from step S71 through step S74 are carried out by a master electronic apparatus.

When a slave electronic apparatus is powered on at step S61, the activation of the apparatus and its battery IDs are sent to the master apparatus at step S62. Upon receiving the starting notice from the slave electronic apparatus at step S71, the master electronic apparatus references the battery information memory according to the transferred battery ID. If the battery ID is not found in the battery information memory, it is registered newly at step S73. When the battery ID exists, its information is sent to the slave electronic apparatus at step S74.

The slave electronic apparatus receives its own battery information from the master electronic apparatus (S63), and stores it in the battery information memory (S64). Each slave electronic apparatus stores and manipulates only its own battery information of the battery currently being used by that apparatus. The remaining battery power is calculated at step S65 and displayed on the display unit at step S66.

Figure 25:
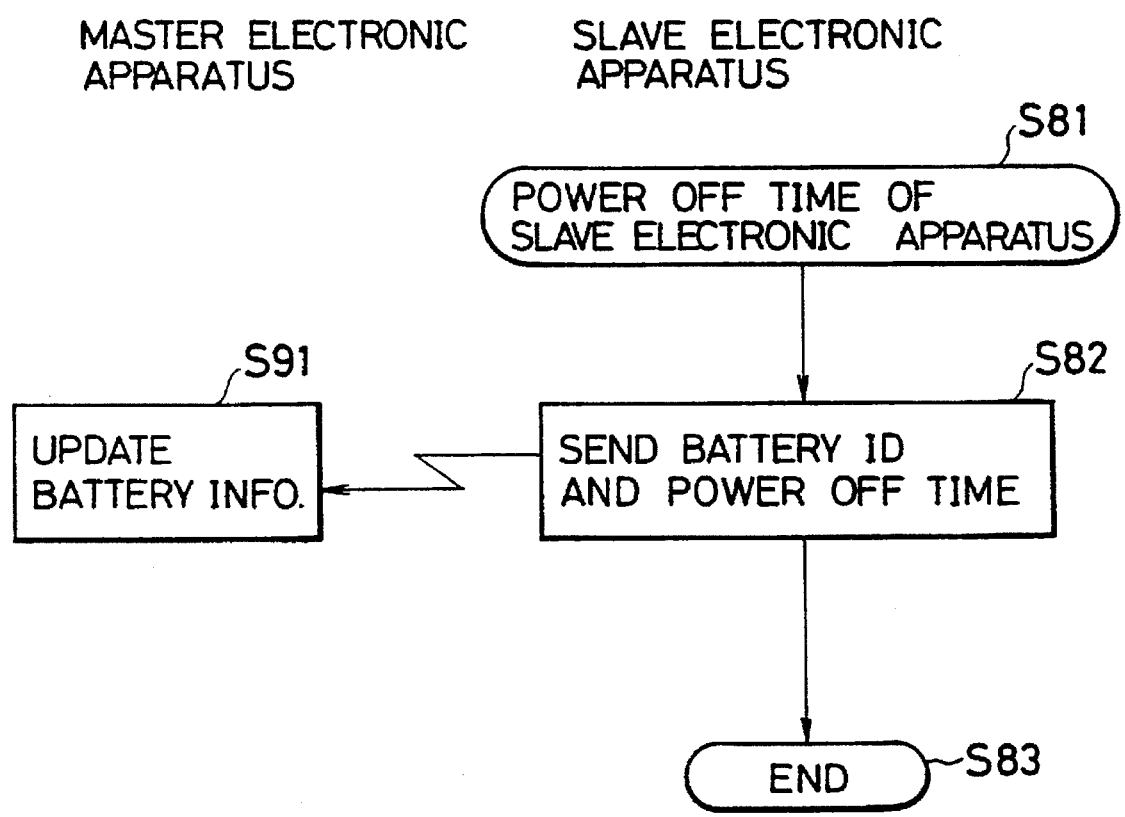
FIG. 25 is an operational flowchart of a battery management system according to the present invention.

FIG. 25 is a flowchart when the operation of a slave electronic apparatus is ended. When the operation of a slave electronic apparatus ends at step S81, necessary information such as the off time and battery IDs are sent to the master electronic apparatus at step S82. The master electronic apparatus updates the information in the battery information memory based on the informed battery IDs.

When the master electronic apparatus and a charger are separate, the charge information is sent to the master electronic apparatus, thus enabling the master electronic apparatus to collectively manage battery information.

The remaining battery power can be correctly obtained even when batteries are exchanged.

In this example, a master electronic apparatus and two or more slave electronic apparatuses are connected via a line with each electronic apparatus storing battery information. When a slave electronic apparatus is started, it receives the information of its own battery from the master electronic apparatus via the line to perform data processing, namely calculate remaining battery power of its own apparatus. In the same way, necessary battery information is sent to the master electronic apparatus when the slave electronic apparatus ends operation. The master electronic apparatus is thus enabled to manage battery information collectively, and correct battery information can be obtained even when batteries are exchanged among electronic apparatuses.

Embodiment 10

FIG. 26 gives another example of items in a battery information memory. FIG. 26 differs from FIG. 12 in containing total accumulated consumption hours in the battery information memory. The total accumulated consumption hours are the total that hours of battery consumption, without being cleared at all. That is, while accumulated consumption hours may be cleared or reduced when a battery is charged, the total accumulated consumption hours are obtained by adding up consumption hours each time the operation has been performed.

By storing the total accumulated consumption hours of a battery, the life of the battery can be determined. When, for instance, the life of a battery is known to be 2,000 hours, this battery management system can indicate to the user that the life of the battery has been out when its accumulated consumption hours exceeds 2,000 hours.

In this example of electronic apparatus according to the present invention, the life of batteries can be detected by storing their total accumulated consumption hours.

Embodiment 11

FIG. 27 shows another example of items in a battery information memory. This memory is different from the one shown in FIG. 9 in containing a charge counter. The charge counter, which indicates the number of times a battery has been charged, is used as one measurement to show the life of the battery. If, for instance, the life of a battery is to be out when it has been charged 600 times, the battery management system informs the user that the battery's life is out, when the charge counter reaches beyond 600. One possible way of managing battery charges is to sort them out into two types: one is a full charging of batteries from nil and the other brief and temporary charges. Brief and temporary charges must not be counted the same way as those from the discharged state to the fully charged ones. Three brief and temporary charges can be assumed as one full charge from the discharged state.

Another method of managing charges can be to distinguish the boosting charges or the quick charges from the trickle charges. In either way, the charge counter is used to inform the user of the expiration of the life of a battery.

In this example of electronic apparatus according to the present invention, the life of a battery can be detected by storing the number of charges.

Embodiment 12

Figure 28:
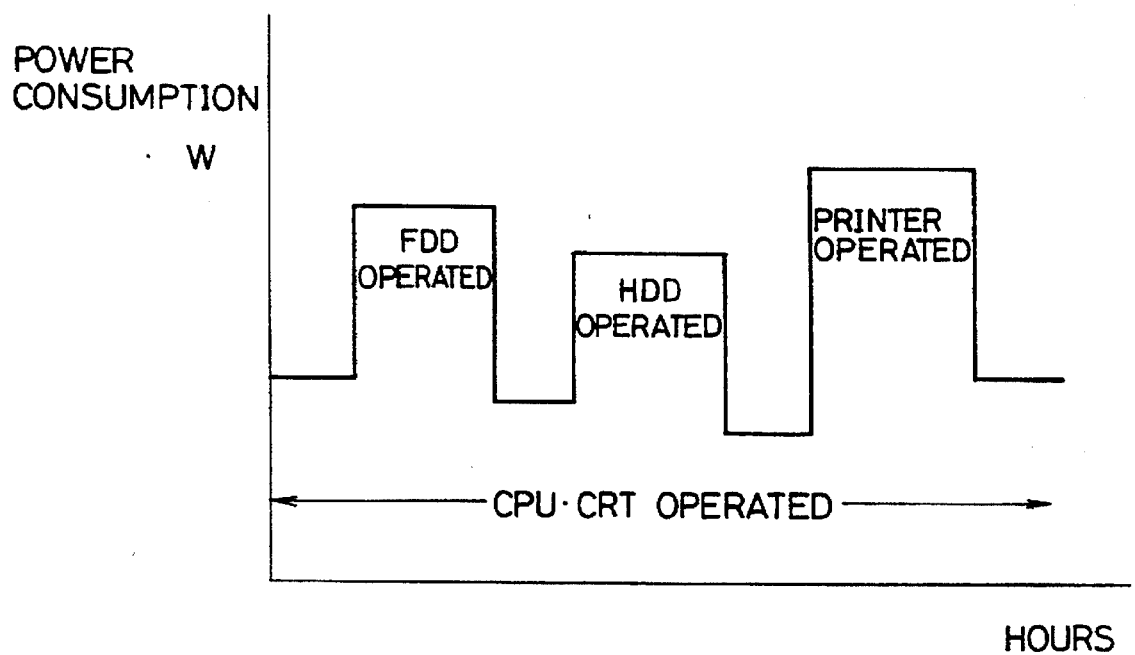
FIG. 28 illustrates the relationships between the consumption hours and power of an electronic apparatus according to the present invention.

FIG. 28 shows how power consumption varies according to the operating state of an electronic apparatus.

For instance, the battery power of a computer is not consumed in proportion to the time spent in an operation. The battery's power consumption of a computer increases as the FDD. HDD or other peripheral devices are used concurrently.

Thus, remaining battery power may not be correctly obtained if only battery consumption hours are factored in. To get remaining battery power more accurately, the use of peripheral devices and hours they are actually used must also be accounted for.

The use of peripheral devices in a certain time period can be found by sampling the peripheral devices periodically. If it is found out that a peripheral device is frequently used, the consumption hours must be modified in the positive. If a printer is continuously used for the sampled ten minutes, for example, the consumption hours is increased by 30 percent to 13 minutes instead of Just assuming 10 minutes.

Figures 29, 30:
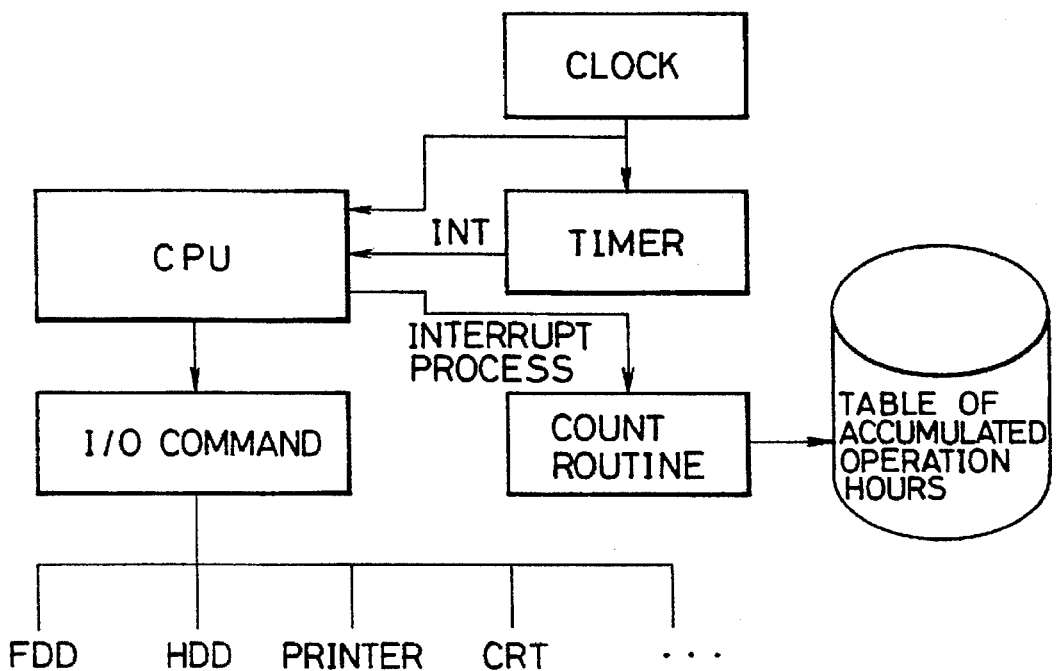
FIG. 29 shows how to correct consumption hours according to the present invention.
FIG. 30 is a table of accumulated consumption hours for correcting consumption hours according to the present invention.

FIG. 29 is a configuration for sampling the operation of peripheral devices. The CPU activates peripheral devices by issuing I/O instructions, which means such peripheral devices as the FDD, HDD, printer, or CRT operate according to the I/O instructions from the CPU. In order to cheek whether or not peripheral devices are operating, an interrupt processing is used. The CPU normally works based on the signals from a clock. In this example, clock signals are incorporated in the timer, and the timer performs counting according to this clock. The timer issues an interrupt to the CPU every second. The CPU then executes a count routine according to the interrupt from the timer. The count routine, which resides in a memory when an electronic apparatus is powered on, processes the interrupt from the CPU. When the count routine is initiated, peripheral devices are checked If they are operating or not. If they are in operation, counting in the table of accumulated consumption hours is updated.

FIG. 30 presents an example of the table of accumulated consumption hours. This accumulated consumption hour table is used to store the counting and the operation hours and the ratio obtained from the counting. The FDD is counted each time it is turned on. In this example, the FDD has been turned on 30 times. Because the count routine checks the peripherals every second, count 30 means that the operation hours comes to 30 seconds. In the same manner, If the HDD and a printer are operating, they are counted by the count routine every second and the operation hours are calculated.

Although the CRT is normally kept on, there are technologies of turning it off or reducing the brightness of its display screen if it is not used for a long time. The count routine counts the time during which the CRT is turned off. The count 300 in this example is construed that the nonoperation hours of the CRT are 5 minutes. The content of this table of accumulated operation hours is updated every second by the count routine.

When the operation hours of an electronic apparatus are 10 minutes, and when the table of accumulated operation hours has been produced as in FIG. 30, the accumulated consumption hours are modified in the positive or in the negative as described below.

The rate in FIG. 30 indicates that 20 percent more power is consumed than usual when the FDD is used. When the FDD is used for 30 seconds, the time to be increased will be 30 sec.×20%=6 sec. The rate for using the HDD will be 1 min×20%=12 sec. In addition, 10 min.×30%=3 min. will be obtained as the rate for using a printer for 10 minutes. Because the CRT is not used for 5 minutes, 5 min.×40%=2 min, must be subtracted from the operation hours.

For instance, if the operation hours are initially calculated to be 10 minutes. It will be modified according to the table of accumulated operation hours, which will be 10 min.+6 sec.+12 sec.+3 min.−2 min.=11 minutes and 18 seconds. In this way, modifications will be made according to the operation hours of peripheral devices when they are used frequently. The battery information will be updated using the operation hours. When the battery information is updated, the count and operation hours in the table of accumulated operation hours are reset. The table of accumulated operation hours is updated from the power on time through the power off time by the count routine.

When the consumption hours in the battery information memory is modified on the basis of this table of accumulated operation hours, the content of the table is cleared.

The amount of operation can also be calculated by measuring the applied current with known techniques and the time of use and integrating them. The remaining battery power can be obtained more accurately as the operation hours are increased or decreased according to the use condition of the peripheral devices.

Embodiment 13

It is possible to add a code to the battery IDs for identifying the type of batteries. Lithium, nickel cadmium, and nickel metal hydride storage batteries are the common available types. The operation hours of these batteries differ although their physical size may be identical. They are also charged by different methods.

Given that their sizes are the same, and if the operation hours for the nickel cadmium storage batteries are assumed to be one hour, the operation hours for the nickel metal hydride storage batteries will be 1.5 times as much, and the lithium storage batteries will be twice that of the nickel cadmium storage batteries, respectively. If the consumption hours of a nickel cadmium storage battery is assumed to be 10 hours when it is fully charged, the consumption hours for a fully charged nickel metal hydride storage battery will be 15 hours. When the operation hours are calculated to be 5 hours based on the battery information, the remaining running hours of a nickel cadmium storage battery comes to 5 hours (10 h−5 h) whereas that for a nickel metal hydride storage battery comes to ten (15 h−5 h). The consumption hours differ even when the shape of batteries are the same. By adding the type of batteries to their IDs, how to charge them or how to calculate remaining power is altered. By adding the type of batteries to the battery IDs, calculation of remaining power or charging method is altered automatically, thereby allowing users to obtain correct remaining battery power without paying attention to the type of batteries.

This example explains how to distinguish three types of batteries with the battery IDs. It is also effective to distinguish the type of batteries by featuring the shape or portion of the battery pack.

Embodiment 14

Previous examples have described how to calculate remaining battery power using the operation hours or the consumption hours. This example shows how to obtain remaining battery power using applied voltage.

Figure 31:
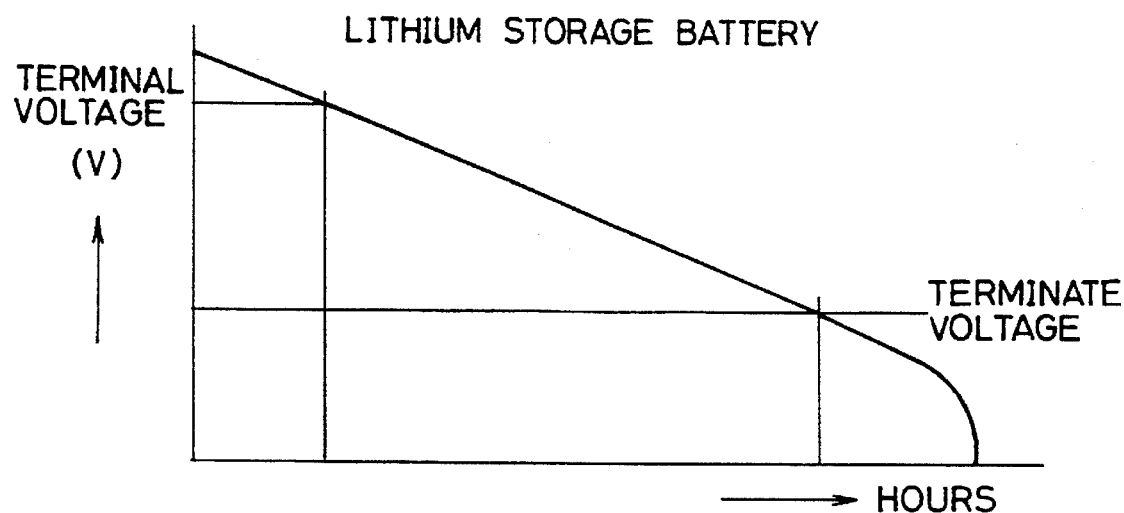
FIG. 31 illustrates another example of using voltage as an battery information according to the present invention.

FIG. 31 shows the charge characteristics of lithium storage batteries. Because the terminal voltage of lithium storage batteries declines linearly in relation to the operation hours, remaining battery power can be easily obtained. The remaining battery power is stored in the battery information memory for each ID as its battery information. All the other operations are the same as those that have explained in the previous examples.

Figure 32:
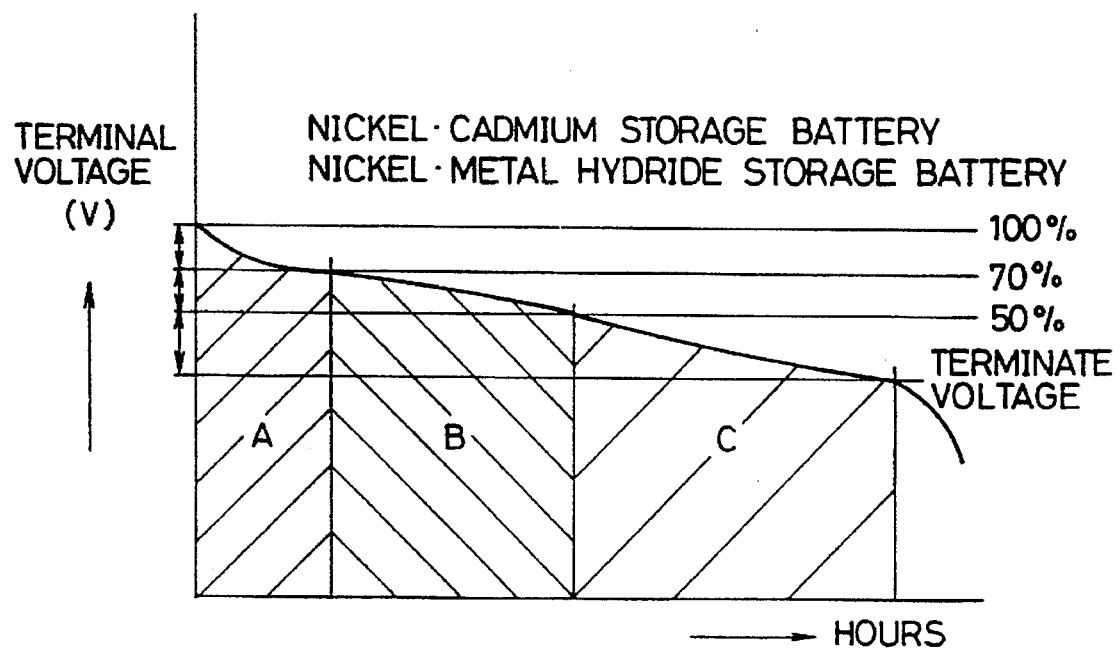
FIG. 32 illustrates another example of using voltage as a battery information according to the present invention.
Figure 33:
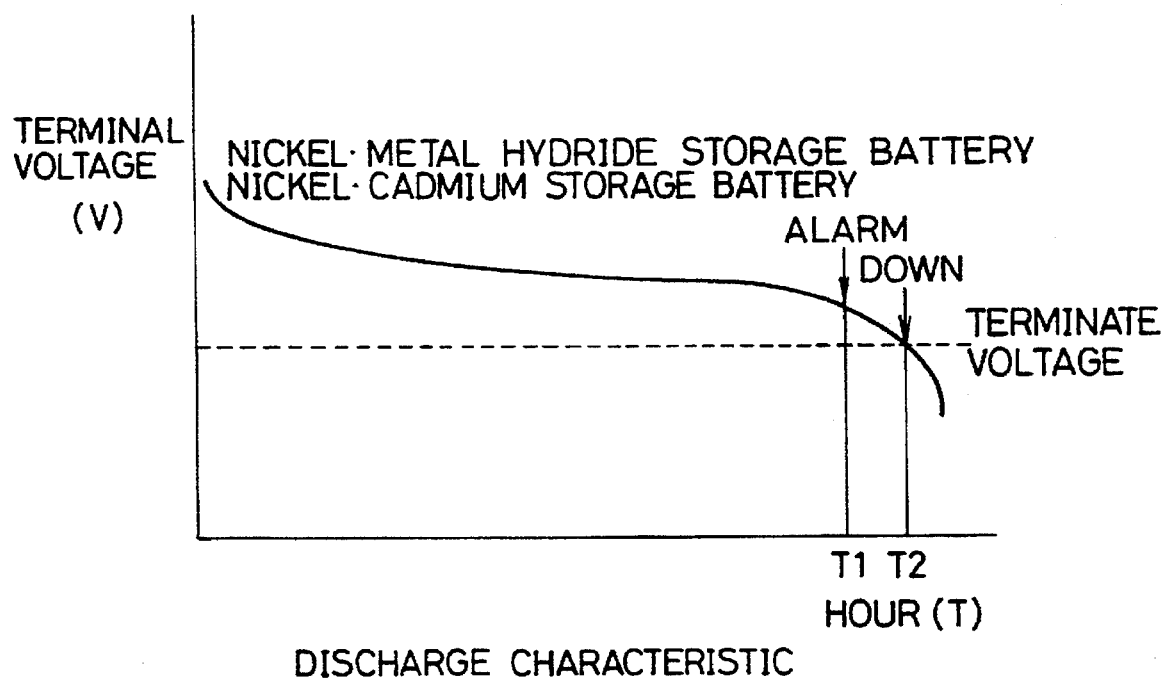
FIG. 33 shows the voltage characteristics of conventional batteries.
Figure 34:
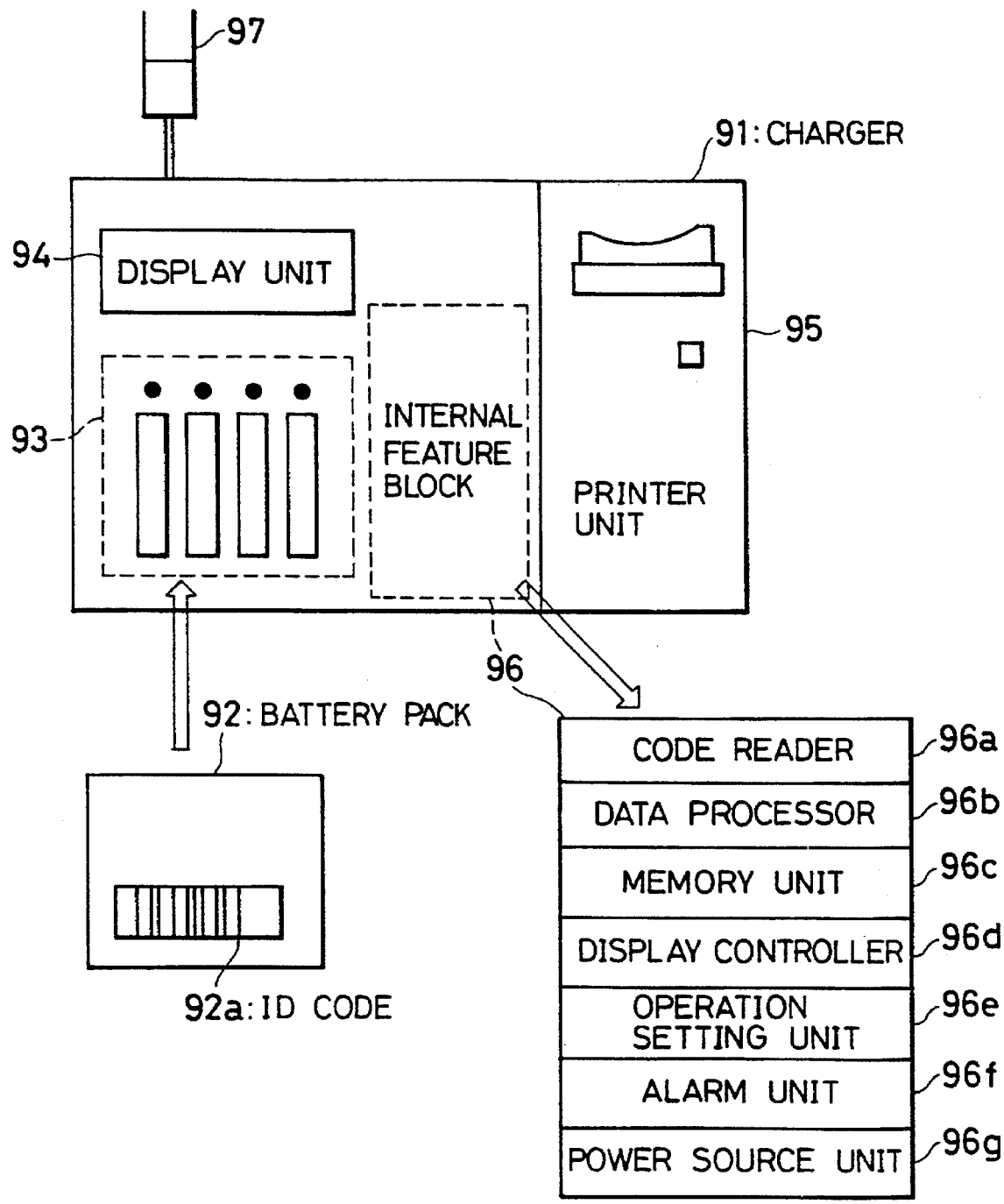
FIG. 34 shows a conventional charger.

FIG. 32 shows the discharge characteristics of nickel cadmium and nickel metal hydride storage batteries, whose voltage is less likely to decline in proportion to the operation hours. It is more difficult to determine the remaining battery power when compared to the lithium storage batteries. It is possible, however, to estimate the remaining power using the terminal voltage. Areas can be roughly divided, as is illustrated in FIG. 32, into area A, area B, and area C according to the consumption hours so as to determine, for instance, that 70 to 100% of the power remains in area A, 50 to 70% in Area B, and 0 to 50% in Area C.

Power can be obtained on the basis of areas divided by the consumption hours, and their information is retained in the battery information memory for each ID as the battery information. All other operations are the same as the previously described examples.

In this way, the remaining battery power can be obtained using the battery voltage and stored as the battery information for each ID. Thus, it is enabled to always display remaining power of a battery even when the battery has not been in use.

In obtaining remaining battery power using voltage, it is unnecessary to store accumulated consumption hours in the memory.

Embodiment 15

Embodiment 15 shows how to calculate remaining battery power which is not based on the consumption hours. It is possible to use the power instead of the consumption hours as the battery information.

For instance, rated capacity of a fully charged battery can be used as the battery information. To use the rated capacity as the battery information, load current that runs while an electronic apparatus is in operation and the integrated value of the hours are calculated. By subtracting this integrated value from the rated capacity, the remaining battery power can be determined.

The remaining battery power can be stored as the battery information for each ID. Other operations are the same as the previously explained examples, thus the explanation is omitted here.

Having thus described one (several) particular embodiment(s) of the invention, various alterations, modifications, and improvements will readily occur to those skilled in the art. Such alterations, modifications, and improvements are intended to be part of this disclosure, and are intended to be within the spirit and scope of the inven- tion. Accordingly, the foregoing description is by way of example only and is limited only as defined in the following claims and the equivalents thereto.

What is claimed is:

1. An electronic apparatus that receives power from a battery, the battery having an identification that indicates characteristics of the battery, the electronic apparatus comprising:
   (a) identification reading means for reading the identification from the battery;
   (b) memory means for storing a table containing the identification and battery information for the corresponding battery, the battery information including power consumption information of the battery;
   (c) update means for updating the power consumption information of the battery based on a value of power consumed from the battery;
   (d) remaining power detect means for detecting a level of remaining power of the battery based on the power consumption information which is updated by the update means;
   (e) output means for indicating the level of the remaining power detected by the remaining power detect means; and
   (f) charge means, coupled to the update means, for charging the battery and for providing the update means with a charge signal indicative of the amount of charge provided to the battery, wherein the memory means includes charge information of the battery as part of the battery information, wherein the update means updates the charge information based on the charge signal, and wherein the remaining power detect means calculates the remaining power based on the battery information including the charge information.

2. The electronic apparatus of claim 1, wherein the identification means includes means for identifying a new identification that is not contained in the table, and wherein the memory means includes register means for registering new battery information when the identification read means reads indicate a new identification which is not contained in the table.

3. The electronic apparatus of claim 1, wherein the power consumption information includes power consumption hours and accumulated consumption hours, and wherein the update means calculates the accumulated consumption hours and updates the battery information, and wherein the remaining power detect means calculates the remaining power of the battery based on the accumulated consumption hours.

4. The electronic apparatus of claim 3, wherein the memory means contains battery information including power on time and power off time and wherein the update means stores the power on time when the power is turned on, stores the power off time when the power is turned off, subtracts the power on time from the power off time to calculate the consumption hours, and adds the consumption hours to the accumulated consumption hours.

5. The electronic apparatus of claim 3, wherein the battery information includes a total accumulated consumption hours of the battery, and wherein the update means updates the total accumulated consumption hours according to the consumption hours of the battery, and wherein the remaining power detect means recognizes a life time of the battery based on the total accumulated consumption hours.

6. The electronic apparatus of claim 1, wherein the identification read means reads the identification based on a bar code attached to the battery.

7. The electronic apparatus of claim 1, wherein the identification read means reads the identification based on a read only memory included in the battery.

8. The electronic apparatus of claim 1, wherein the identification read means reads the identification based on a switch provided for the battery.

9. The electronic apparatus of claim 1, wherein the identification read means reads the Identification based on a physical shape of the battery.

10. The electronic apparatus of claim i, wherein the identification read means reads the identification based on a pattern attached to the battery.

11. The electronic apparatus of claim 1, wherein the battery information contained in the memory means includes accumulated consumption hours of the battery, and wherein the update means updates the accumulated consumption hours based on the charge information.

12. The electronic apparatus of claim 11, wherein the update means clears the accumulated consumption hours when the battery is fully charged by the charge means.

13. The electronic apparatus of claim 1, further comprising discharge means for discharging power of the battery, wherein the charge means fully charges the battery after the discharge means discharges the power of the battery.

14. The electronic apparatus of the claim 1, wherein the battery information includes a number of times the battery has been charged, and wherein the update means updates the number of times the battery has been charged based on the charge signal from the charge means, and wherein the remaining power detect means recognizes a life time of the battery based on the number of times the battery has been charged.

15. The electronic apparatus of claim 1, wherein a plurality of peripheral devices are powered by the battery, and wherein the electronic apparatus further comprises, monitoring means for monitoring the peripheral devices to obtain performing time of each peripheral device, and adjust means for adjusting the power consumption hours calculated by the update means according to the performing time.

16. An electronic apparatus that receives power from a battery, the battery having an identification that indicates characteristics of the battery, the electronic apparatus comprising:

identification reading means for reading the identification from the battery;

memory means for storing a table containing the identification and battery information for the corresponding battery, the battery information including power consumption information of the battery;

update means for updating the power consumption information of the battery based on a value of power consumed from the battery;

remaining power detect means for detecting a level of remaining power of the battery based on the power consumption information which is updated by the update means;

output means for indicating the level of the remaining power detected by the remaining power detect means;

a power supply;

switch means, coupled to the battery and the power supply, for selecting one of the battery and the power supply to supply power as a power source to the electronic apparatus; and power source recognize means for recognizing whether the power source selected by the switch means is the battery or the power supply, wherein the update means updates the battery information when the power source recognize means recognizes that the power source is the battery.

17. An electronic apparatus that receives power from a battery, the battery having an identification that indicates characteristics of the battery, the electronic apparatus comprising:

identification reading means for reading the identification from the battery;

memory means for storing a table containing the identification and battery information for the corresponding battery, the battery information including power consumption information of the battery;

update means for updating the power consumption information of the battery based on a value of power consumed from the battery;

remaining power detect means for detecting a level of remaining power of the battery based on the power consumption information which is updated by the update means;

output means for indicating the level of the remaining power detected by the remaining power detect means; and wherein the battery has a battery type, and the identification includes the battery type and wherein the remaining power detect means has a plurality of detection methods for detecting the level of the remaining power and selects one of the detection methods based on the battery type included in the identification.

18. In an electronic apparatus which receives power from a battery having an identification, the electronic apparatus including an identification reading means for reading the identification from the battery, memory means for storing a table that contains battery information, means for updating the battery information, means for detecting remaining power of the battery and means for indicating the level of remaining power, a method for managing said battery, the method comprising the steps of:

(a) reading the identification from the battery;

(b) searching the memory means containing the battery information for the identification read in step (a), wherein the battery information includes a power-on time and a power-off time of the battery, power consumption time and accumulated consumption time;

(c) setting the power-on time in the battery information in the memory means, according to the identification;

(d) setting the power-off time in the battery information in the memory means, according to the identification;

(e) calculating the power consumption time of the battery and accumulating the power consumption time in the battery information in the memory means; and (f) detecting a level of a remaining power in the battery, based on the accumulated consumption time and outputting the level of the remaining power detected;

(g) registering a new identification in the battery information in the memory means when the identification read in step (a) is not found in the battery information in the memory by step (b);

(h) periodically repeating the calculating step, the adding step, the detecting step and the displaying step in order to display the current level of remaining power periodically; and (i) charging the battery with a charger and updating the accumulated consumption time.

19. The method for detecting remaining power of the battery of claim 18, further comprising the step of calculating current power consumption of the battery based on the power-on time in the battery information and a current time;

adding the current power consumption time and the accumulated consumption time in the battery information in order to calculate a current accumulated consumption time;

detecting a current level of the remaining power of the battery based on the accumulated consumption time; and displaying the current level of the remaining power of the battery.

20. The method for detecting remaining power of the battery of claim 18, further comprising the step of discharging the battery before charging the battery.

21. In an electronic apparatus which receives power from a battery having an identification, the electronic apparatus including an identification reading means for reading the identification from the battery, memory means for storing a table containing battery information, means for updating the battery information, means for detecting remaining power of the battery and means for indicating the level of remaining power, a method for managing said battery, the method comprising the steps of:

(a) reading the identification from the battery;

(b) searching the memory means containing the battery information for the identification read in step (a), wherein the battery information includes a power-on time and a power-off time of the battery, power consumption time and accumulated consumption time;

(c) setting the power-on time in the battery information in the memory means, according to the identification;

(d) setting the power-off time in the battery information in the memory means, according to the identification;

(e) calculating the power consumption time of the battery and accumulating the power consumption time in the battery information in the memory means; and (f) detecting a level of a remaining power in the battery, based on the accumulated consumption time and outputting the level of the remaining power detected; and (g) communicating the battery information between a plurality of electronic apparatuses in order to share latest battery information.

* * * * *